(12) United States Patent
Pan et al.

(10) Patent No.: US 8,437,299 B2
(45) Date of Patent: May 7, 2013

(54) RADIO CHANNEL AGGREGATION AND SEGMENTATION

(75) Inventors: Chengzhi Pan, San Diego, CA (US); Joseph P. Burke, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 303 days.

(21) Appl. No.: 12/857,729

(22) Filed: Aug. 17, 2010

(65) Prior Publication Data

US 2012/0044927 A1 Feb. 23, 2012

(51) Int. Cl.
*H04J 3/00* (2006.01)
*H04W 4/00* (2009.01)

(52) U.S. Cl.
USPC .......................... 370/329; 370/341; 370/345

(58) Field of Classification Search ............... None
See application file for complete search history.

(56) References Cited

U.S. PATENT DOCUMENTS

| | | | |
|---|---|---|---|
| 5,412,386 A | 5/1995 | Sezi | |
| 5,461,610 A | 10/1995 | Weerackody | |
| 6,369,735 B1 | 4/2002 | Yang | |
| 2006/0284754 A1 | 12/2006 | Garrity et al. | |
| 2008/0166125 A1* | 7/2008 | Laamanen | 398/71 |
| 2009/0245292 A1* | 10/2009 | Koganei | 370/535 |
| 2011/0210880 A1* | 9/2011 | Hainz | 341/141 |
| 2011/0299630 A1* | 12/2011 | Petrovic | 375/340 |

FOREIGN PATENT DOCUMENTS

| WO | WO2004030222 | 4/2004 |
|---|---|---|
| WO | WO2009010583 | 1/2009 |

OTHER PUBLICATIONS

Scaglione et al., "Optimal Designs for Space-Time Linear Precoders and Decoders", IEEE Transactions on Signal Processing, vol. 50, No. 5, pp. 1051-1064 (May 2002).
Tzeng et al., "A CMOS Code-Modulated Path-Sharing Multi-Antenna Receiver Front-End", IEEE Journal of Solid-State Circuits, vol. 44, No. 5, pp. 1321-1335 (May 2009).
Goodenough F "Delta-Sigma ADCS Gain Performance Highs, Add Multiplexing", Electronic Design, Penton Media, Cleveland, OH, US, vol. 43, No. 16, Aug. 7, 1995, XP000531675.
International Search Report and Written Opinion—PCT/US2011/047981—ISA/EPO—Nov. 22, 2011.
Philip R.B., et al., "Achievable diversity limits in a quantized MIMO-OFDM linear pre-coded system", Wireless Pervasive Computing (ISWPC), 2010 5th IEEE International Symposium on, IEEE, Piscataway, NJ, USA, May 5, 2010, pp. 455-459, XP031688751.

\* cited by examiner

*Primary Examiner* — Chi H Pham
*Assistant Examiner* — Soon-Dong D Hyun
(74) *Attorney, Agent, or Firm* — Kevin T. Cheatham

(57) ABSTRACT

Multiple streams from multiple circuit paths are Block-TDM (Block-Time-Division-Multiplexing) aggregated into a single stream that passes via a single path through processing circuitry capable of handling the aggregated signal. The cost of providing redundant processing circuitry is avoided. After processing in the single path, the resulting signal is Block-TDM de-aggregated to generate multiple streams. Each output stream is substantially the same as if its corresponding input stream had been processed in a separate path using separate processing circuitry. The path-sharing technique is usable to pass multiple streams from multiple radio receivers through one superior Delta-Sigma ADC (DSADC) as opposed to using multiple flat ADCs to process information from the multiple receivers. In one example, the DSADC can be used because the aggregation is Block-TDM-based and the de-aggregator involves a digital low pass filter. In another example, the de-aggregator involves a decoder and the aggregator involves a precoder.

45 Claims, 19 Drawing Sheets

MULTIPLE RECEIVE SIGNAL
PATHS BUT ONLY ONE ADC

SAMPLER

DELTA-SIGMA ADC

ANALOG SWITCHED-CAPACITOR
BLOCK-TDM MULTIPLEXER CIRCUIT

WAVEFORMS OF BLOCK-TDM MULTIPLEXER

BLOCK-TDM MULTIPLEXER TIMING

BLOCK-TDM DEMULTIPLEXER

SIGNAL INTO AGGREGATOR

SIGNAL OUT OF DSADC

SIGNAL AFTER DLPF

SIGNAL AFTER DEMULTIPLEXER

MMSE PRECODING AND DECODING

BLOCK-TDM SEGMENTING AND DE-SEGMENTING

RADIO CHANNEL AGGREGATION AND SEGMENTATION

BACKGROUND INFORMATION

1. Technical Field

The present disclosure relates to channel aggregation (i.e., path-sharing) and to channel segmentation (i.e., path-partitioning) in radio circuits.

2. Background Information

Many future radio systems will likely include radio transmitters and/or receivers that communicate using multiple antennas, and communicate with a given antenna over multiple frequency carriers, and that for a given frequency carrier and antenna combination involve separate In-phase (I) and Quadrature phase (Q) signal paths. A straightforward way to implement such a receiver is to provide a separate hardware signal path for each permutation of antenna, frequency carrier, and I/Q signal. For example, in one possible implementation of the LTE-A (Long Term Evolution—Advanced) wireless communication standard an 8×8 MIMO (Multiple-Input and Multiple-Output) transceiver uses eight antennas for receiving. The receiver of the transceiver may receive on any one of four LTE carriers using any one antenna. Accordingly, thirty-two signal paths through the receiver may be provided. Moreover, each of these signal paths actually involves an I signal path and a Q signal path, so in total there may be sixty-four signal paths realized in hardware in the receiver. Providing this much hardware would be costly and would result in a large amount of power consumption. To avoid the power and cost of providing possibly redundant hardware, path-sharing techniques can be employed. In a path-sharing technique, multiple incoming signals received via multiple incoming signal paths are aggregated into a single signal. This single signal is then made to pass through a single hardware signal path and processing path as an aggregated stream. After processing, the aggregated stream is then de-aggregated to regenerate multiple signals where each signal is then made to continue through the system along its own signal path. Such aggregation and de-aggregation techniques can be practiced to different degrees depending on the application and performance requirements.

FIG. 1, FIG. 2 and FIG. 3 (Prior Art) are simplified diagrams of a cellular telephone handset 1. These diagrams illustrate a situation where utilizing path-sharing to reduce circuit cost would be desirable. Cellular telephone handset 1 involves, among other parts not illustrated here, two antennas 2 and 3, a RF (Radio Frequency) transceiver integrated circuit 4, and a digital baseband processor integrated circuit 5. A processor 6 on the digital baseband processor integrated circuit 5 executes programs of instructions stored in memory 7 and controls transceiver circuitry on the RF transceiver integrated circuit 4 by sending control information to the RF transceiver integrated circuit 4 via serial bus 8. Multiple outgoing signal paths extend from Digital-to-Analog Converters (DAC) 9-12 via inter-chip conductors 13-16 to transmitter circuitry on the RF transceiver integrated circuit 4. Multiple incoming signal paths extend from the RF transceiver integrated circuit 4 via inter-chip conductors 17-20 to Analog-to-Digital Converters (ADC) 21-24 on the digital baseband integrated circuit 5.

FIG. 2 (Prior Art) is a more detailed diagram of the transceiver circuitry in RF transceiver integrated circuit 4 and the multiple signal paths between the RF transceiver integrated circuit 4 and the baseband processor integrated circuit 5. There are two transmit chains 25 and 26 and there are two receive chains 27 and 28.

FIG. 3 (Prior Art) is a more detailed diagram of one of the receive chains 28. After the LNA (Low Noise Amplifier) 29 there are two signal paths involving a mixer and a baseband filter. A first signal path involves In-phase (I) mixer 30 and baseband filter 31. A second signal path involves Quadrature phase (Q) mixer 32 and baseband filter 33. Similarly, there are two separate paths from the RF transceiver integrated circuit to the digital baseband processor integrated circuit and to two separate ADCs 23 and 24. Because providing all this hardware is costly and consumes a large amount of power as described above, efforts may be made to use aggregation and de-aggregation techniques to share circuit paths. Furthermore, reducing the pin count (here from integrated circuit 4 to integrated circuit 5) by sharing circuit paths is also of great value for reducing the integrated circuit packaging cost as well as reducing printed circuit board area. Tzeng et al., "A CMOS Code-Modulated Path-Sharing Multi-Antenna Receiver Front-End", IEEE Journal of Solid-State Circuits, Vol. 44, No. 5, pages 1321-1335 (May 2009) describes a path-sharing scheme whereby multiple blocks in a multi-antenna receiver can be shared. The code-modulated scheme described, however, would have undesirably limited performance and/or would be undesirably large and costly to implement in future high performance MIMO LTE-A applications. More advanced aggregation and de-aggregation structures and methods are sought that can be implemented in a smaller amount of integrated circuit area and can simultaneously provide superior performance and low power consumption.

It is also possible that the bandwidth of a single channel be larger than what a single DSADC can handle. For example, LTE-A may have a channel bandwidth of 100 MHz, while a current state-of-the-art DSADC can typically only handle 40 MHz signals efficiently. A simple solution is to treat the channel as three channels, with bandwidths of 40 MHz, 40 MHz, and 20 MHz each, and then to use three circuit paths (specifically including three LOs) to receive them. This approach, however, involves an undesirably large amount of circuit area and a large amount of power consumption. Therefore, more advanced channel segmentation and de-segmentation structures and methods are sought that can be implemented in a smaller amount of integrated circuit area and can simultaneously achieve low power consumption.

SUMMARY

Multiple input streams from multiple circuit paths are Block-TDM aggregated into a single stream. In one example, a separate such circuit path exists in a MIMO LTE-A receiver for each combination of antenna, LTE carrier, and I/Q path. The MIMO receiver may receive using multiple antennas, using multiple carriers (a different carrier corresponds to a different channel), and each antenna/carrier combination can involve separate I and Q signal paths. After Block-TDM aggregation the resulting aggregated single stream passes via a single path through processing circuitry capable of handling the combined data of the aggregated signal. Costs of providing redundant processing circuitry and multiple signal paths through the processing circuitry are avoided because only a single signal path and a single processing circuit is employed. After efficient processing in the single path using the single processing circuit, the resulting aggregated signal is Block-TDM de-aggregated to generate multiple output streams. Each output stream is substantially the same as if its corresponding input stream had been processed in a separate path using separate processing circuitry.

In a first aspect, Block-TDM aggregating/de-aggregating is used to pass multiple input streams received from multiple radio receivers through a single Analog-to-Digital Converter (ADC) as opposed to using multiple ADCs to process information from the multiple receivers. Large-bandwidth ADCs in radio receivers such as the receivers of cellular telephone handsets are typically relatively large circuits that consume relatively large amounts of power. Consequently, reducing the number of such ADCs in such radio receivers is generally highly desirable. The Block-TDM aggregator operates in the analog domain and includes a Block-TDM multiplexer. In one example, the Block-TDM multiplexer is a switched-capacitor circuit that involves a set of capacitors for each incoming stream to be aggregated. Analog voltage level values of the incoming streams are stored in the capacitors as voltage levels. The capacitors are coupled to an output of the Block-TDM multiplexer one at a time in such an order and with such a rate that the analog voltage level values appear on the output in block-TDM order.

In a second aspect, due to the use of Block-TDM aggregating/de-aggregating and a suitably designed Digital Low Pass Filter (DLPF) in the de-aggregator, the ADC that processes the aggregated stream is a Delta-Sigma ADC (DSADC) that has desirable noise-shaping qualities and has superior performance as compared to flat ADCs used in conventional CDM-based path-sharing techniques. For still higher performance (less signal degradation of the signal due to aggregation and de-aggregation), an MMSE decoder is used in the de-aggregator rather than the DLPF. A precoder is also optionally used in the aggregator to transform the data in the aggregated stream prior to the data being supplied to the DSADC so that the data is less susceptible to the noise-generating characteristics of the DSADC. DSADC transfer function and noise performance is characterized and the results of the characterization are used to tailor the decoder and the precoder to optimize overall path-sharing performance depending on the characteristics of the particular DSADC used.

In a third aspect, Block-TDM segmenting is used to segment a single higher bandwidth incoming stream into multiple lower bandwidth streams. If, for example, processing requirements to process a high bandwidth stream exceed the capabilities of a particular processing circuit, then multiple instances of the processing circuit can be provided. The Block-TDM segmenting technique is used to segment the single incoming stream into multiple lower bandwidth streams, where each of the lower bandwidth streams is processed at a slower rate by a separate instance of the processing circuit. The resulting processed streams as output by the multiple instances of the processing circuit are then Block-TDM de-segmented to combine the streams into a single higher bandwidth output stream. The resulting higher bandwidth output stream is substantially the same as if the single incoming stream had been processed by a single instance of the processing circuit that had an adequately high bandwidth to handle the single incoming stream. In one example, the processing circuit that is provided in multiple instances is a Delta-Sigma ADC in a radio receiver and the single incoming high bandwidth stream is a stream output by a baseband filter of the receiver.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
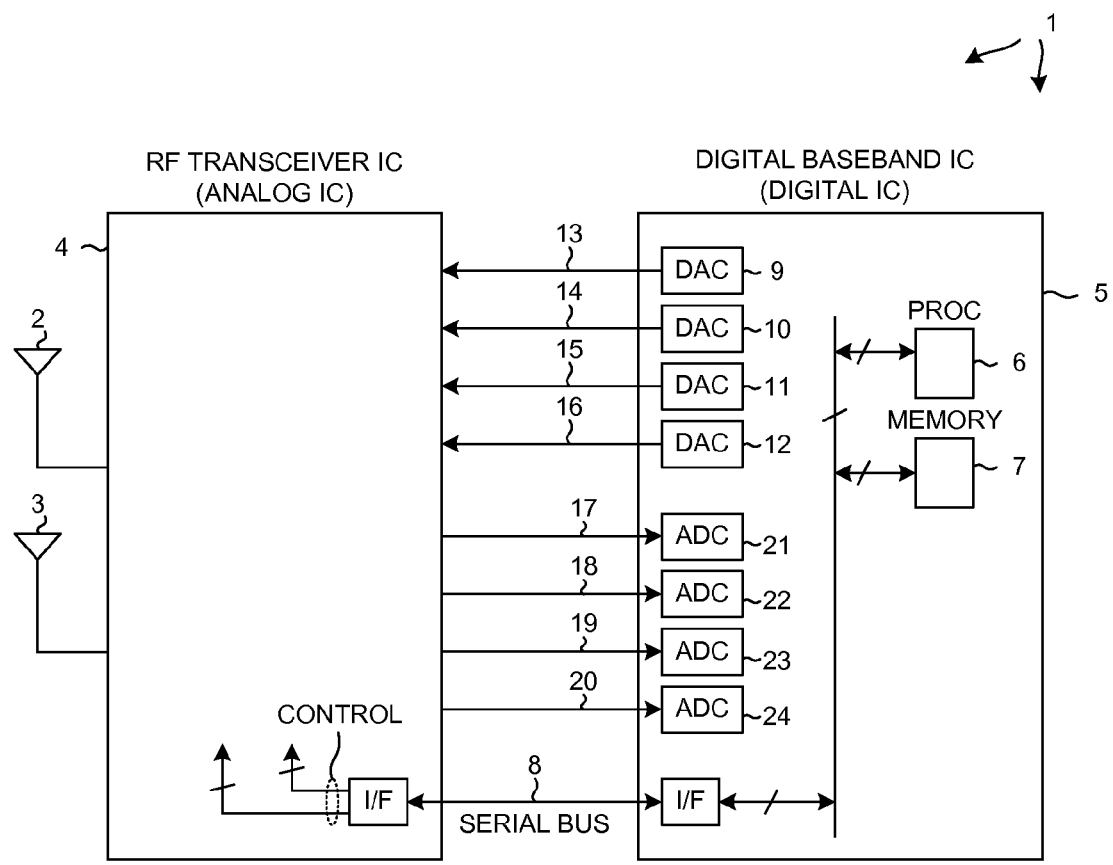
FIG. 1 is a simplified diagram of a cellular telephone handset in which implementing path-sharing would be desirable.
Figure 2:
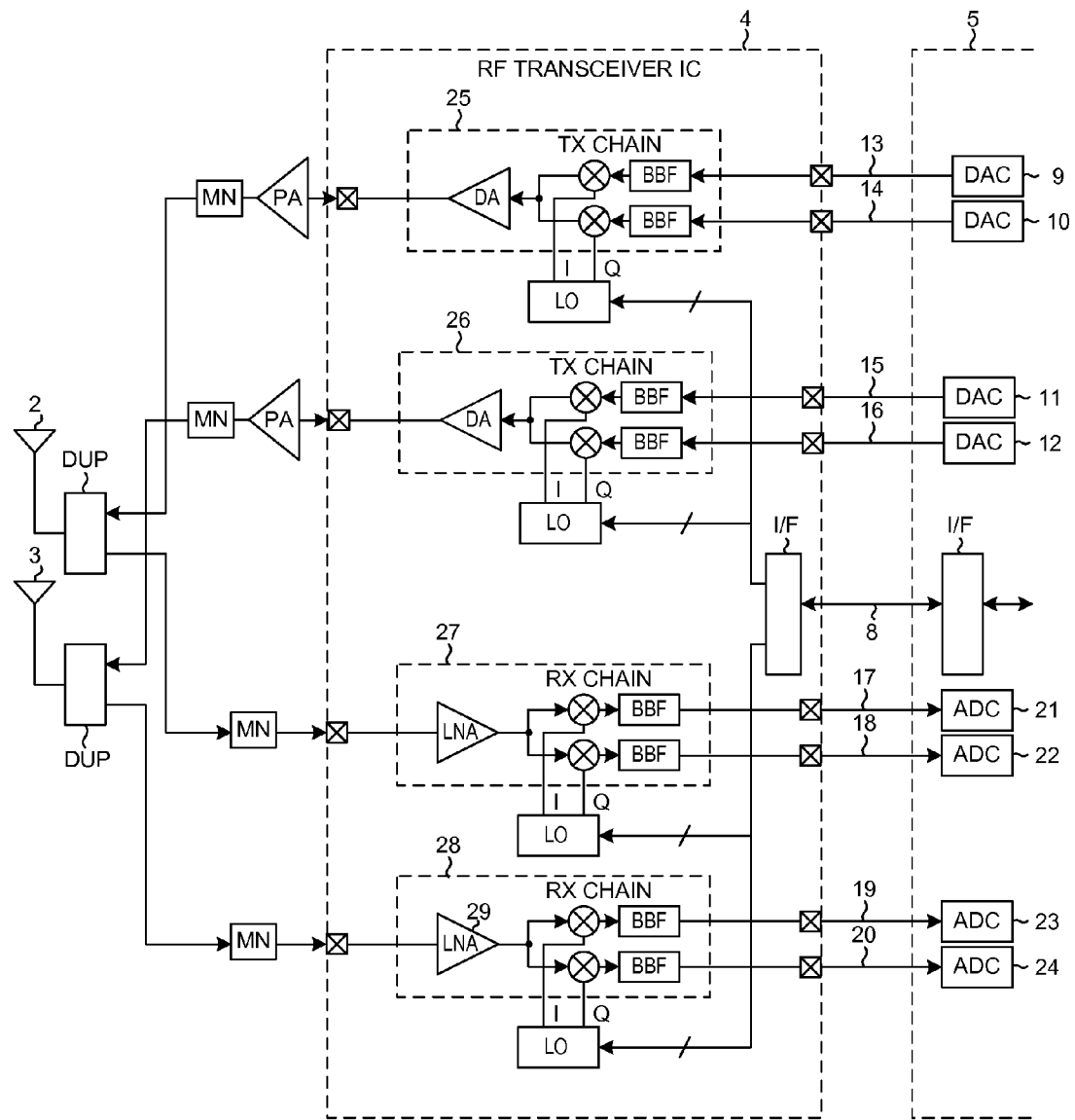
FIG. 2 (Prior Art) is a more detailed diagram of the transceiver circuitry of the cellular telephone handset of FIG. 1.
Figure 3:
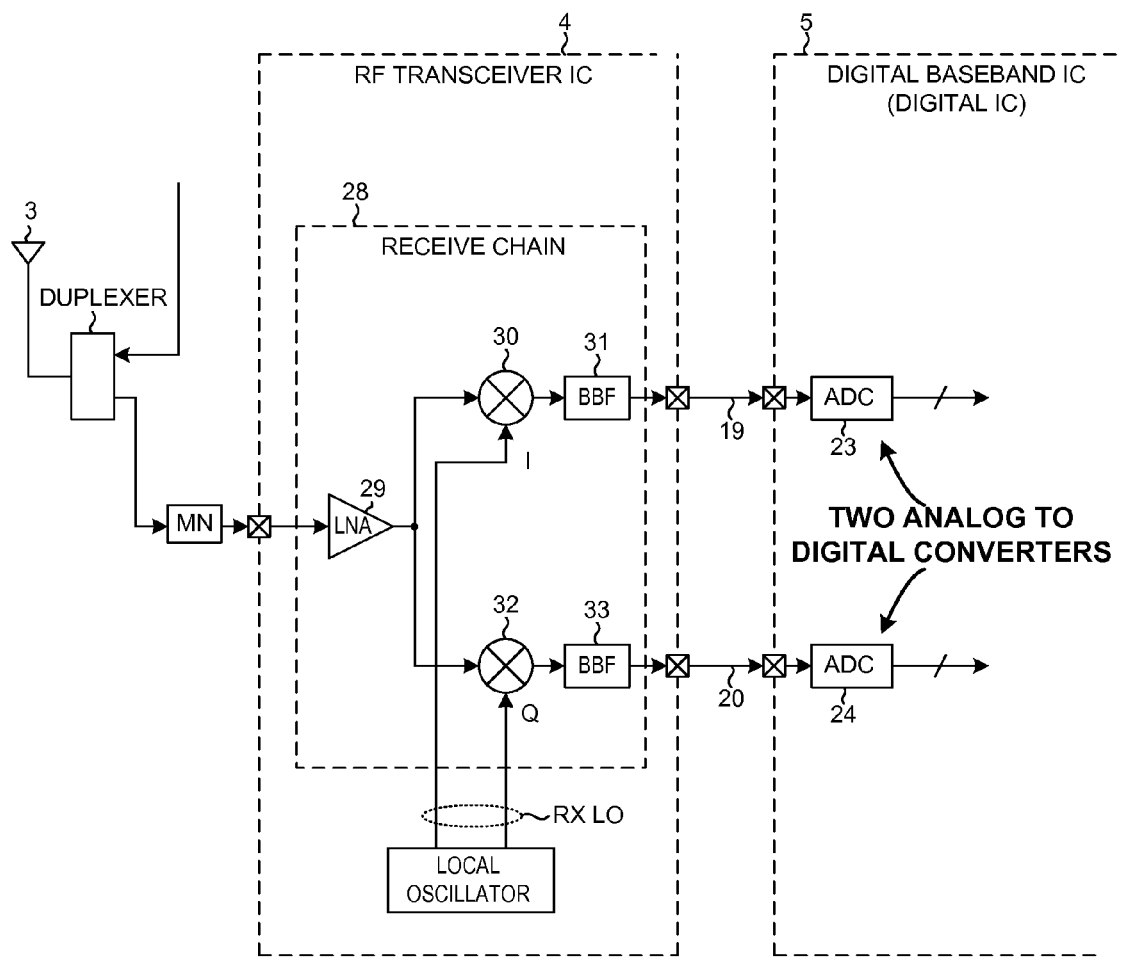
FIG. 3 (Prior Art) is a more detailed diagram of one of the receive chains in the transceiver circuitry of FIG. 2.
Figure 4:
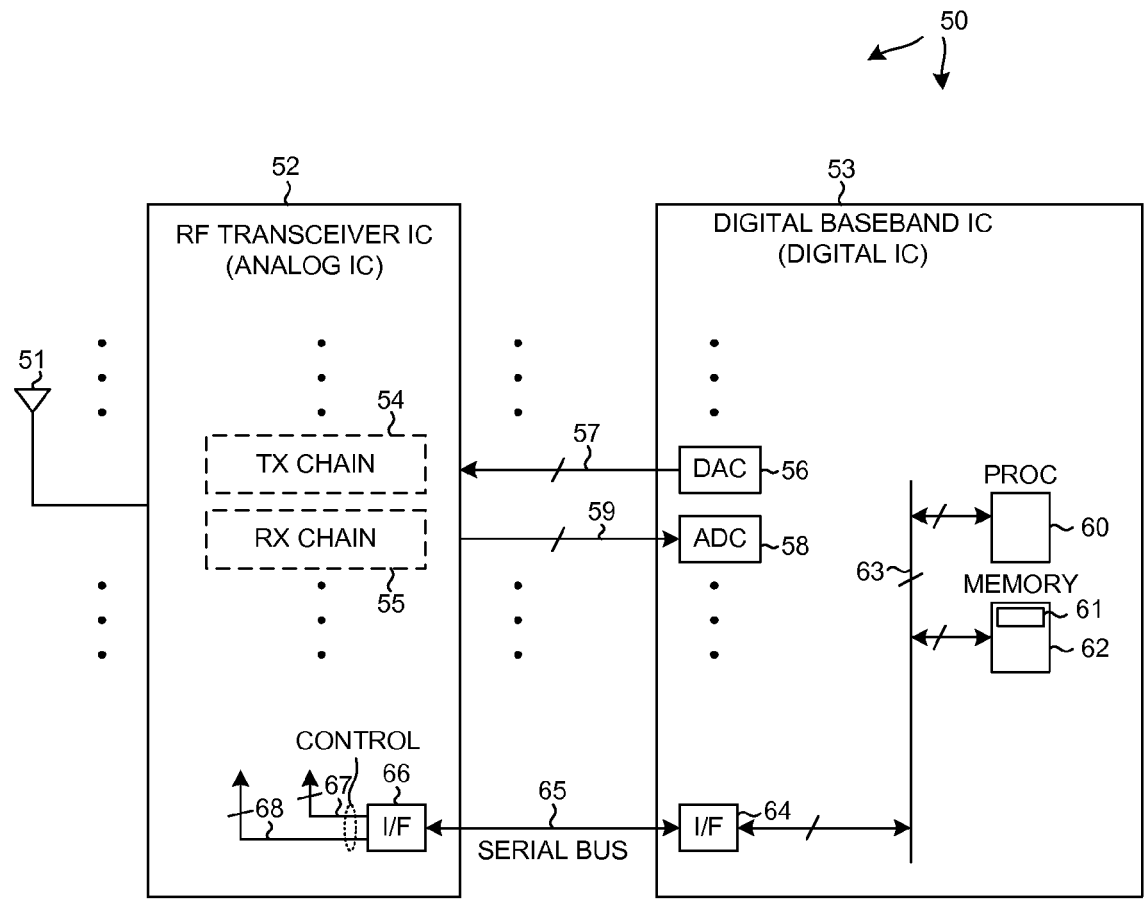
FIG. 4 is a high-level simplified diagram of a mobile communication device that includes a specific embodiment of Block-TDM aggregation and de-aggregation circuitry and functionality in accordance with a first novel aspect.

FIG. 4 is a high-level simplified diagram of an apparatus 50 (a mobile communication device) that includes a specific embodiment of Block-TDM (Block-Time-Division-Multiplexing) aggregation and de-aggregation circuitry and functionality in accordance with a first novel aspect. The Block-TDM aggregation and de-aggregation structures and methods set forth and described in this patent document see wide applicability to both receivers and to transmitters, and to transceiver devices involving different numbers of antennas, and to transceiver devices involving different numbers of communication carriers and different kinds of analog-to-digital conversion circuitry. The analog and digital functionality of the transceivers may be divided and partitioned in different ways in different embodiments. Block-TDM aggregation and de-aggregation can be performed on signals coming from, or going to, multiple antennas. Block-TDM aggregation and de-aggregation can also be performed on signal paths that would otherwise pass through separate transmitters or separate receivers even though only one antenna may be used. Block-TDM aggregation and de-aggregation can also be performed on I and Q signal paths for signals coming from, or going to, a single antenna via a single transmitter or receiver. The specific embodiment of FIGS. 4-6 that involves I and Q path aggregating and de-aggregating of signals coming from a single antenna and passing through a single receiver is chosen here for ease and clarity of explanation. The specific embodiment is presented here to show how the novel Block-TDM aggregation and de-aggregation of the present patent document can be applied to a structure similar to the prior art structure of FIGS. 1-3 with beneficial effect.

FIRST NOVEL ASPECT: Apparatus and mobile communication device 50 includes, among other parts not illustrated here, an antenna 51, a RF (Radio Frequency) transceiver integrated circuit 52, a digital baseband integrated circuit 53. RF transceiver integrated circuit 52 includes a transmit chain 54 and a receive chain 55 that communicate via antenna 51. There is only one Digital-to-Analog Converter (DAC) 56 that supplies analog information to transmit chain 54 via one set of conductors 57 as compared to the case in FIG. 2 where there are two DACs for each transmit chain and where each DAC is coupled to the RF transceiver integrated circuit by a separate set of conductors. In the device 50 of FIG. 4 there is also only one Analog-to-Digital Converter (ADC) 58 that receives analog information from receive chain 55 via one set of conductors 59 as compared to the case of FIG. 2 wherein there are two ADCs for each receive chain and wherein each ADC is coupled to the RF transceiver integrated circuit by a separate set of conductors. A processor 60 accesses and executes a program 61 of processor-executable instructions stored in memory 62 (a processor-readable medium). Execution of this program causes processor 60 to control the RF transceiver integrated circuit 52 by sending appropriate control information to the RF transceiver via local bus 63, serial bus interface circuitry 64, serial bus 65, serial bus interface circuitry 66, and control conductors 67 and 68. The sets of three colinear dots in FIG. 4 indicate that the device 50 includes multiple sets of this antenna/TX chain/RX chain/DAC/ADC structure.

Figure 5:
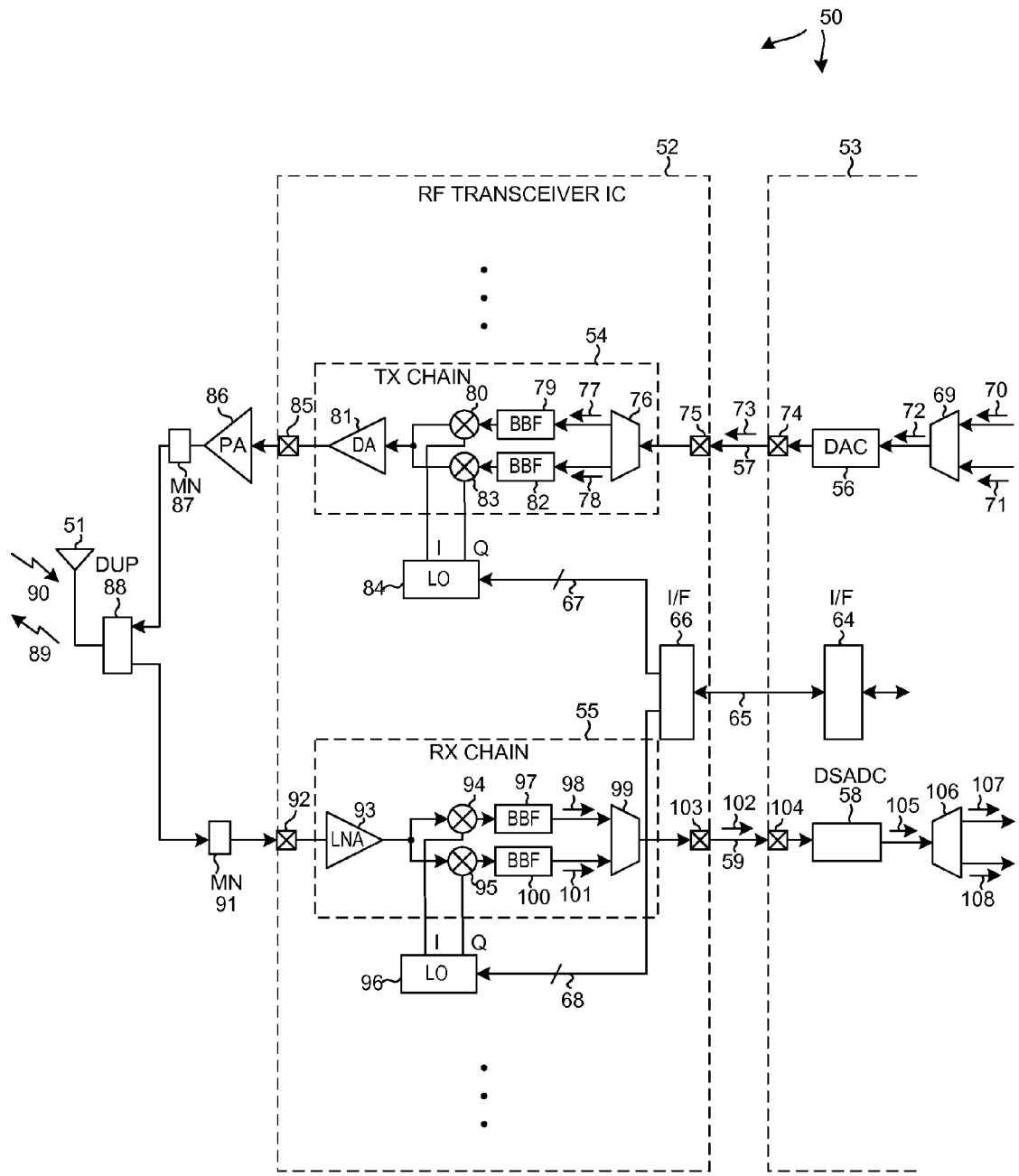
FIG. 5 is a more detailed diagram of a portion of FIG. 4.

FIG. 5 is a more detailed diagram of a portion of FIG. 4. Information to be transmitted originates in digital baseband processor integrated circuit 53 in the form of two signal streams 70 and 71 (an I signal stream and a Q signal stream) on two different signal paths. Block-TDM (Block-Time Division Multiplexing) aggregator 69 aggregates these two streams 70 and 71 into a single aggregated stream 72 that is then digitized by DAC 56. The resulting analog information signal stream 73 passes to RF transceiver integrated circuit 52 via one signal path involving one set of terminals 74 of the baseband processor integrated circuit, one set of conductors 57, one set of terminals 75 of the RF transceiver integrated circuit. A Block-TDM de-aggregator 76 de-aggregates the stream into two streams 77 and 78 (an I signal stream and a Q signal stream). The I stream 77 passes through a baseband filter 79 and a mixer 80 to an input of a driver amplifier 81. The Q stream passes through a baseband filter 82 and a mixer 83 to the input of the driver amplifier 81. I and Q clock signals are supplied to the mixers 80 and 83 by a local oscillator circuit 84. Mixers 80 and 83 constitute an upconverting quadrature mixer. Driver amplifier 81 amplifies the upconverted signal and supplies it via terminal 85 to power amplifier 86. Power amplifier 86 amplifies the signal further and supplies it via matching network 87 and duplexer 88 to antenna 51 for transmission as transmission 89. Of importance, note that there is only one DAC that supplies analog information to the transmit chain 54. Also of importance is the fact that there is only one signal path and associated hardware conductors and terminals between the integrated circuit 53 and the integrated circuit 52 to communicate the analog signal output 73 of DAC 56 to the transmit chain 54.

If a communication 90 is received on antenna 51 then it passes through duplexer 88 and a matching network 91 and terminals 92 to the input of an LNA 93 of the receive chain 55. The receive chain 55 includes two mixers 94 and 95 that together form a downconverting quadrature mixer. I and Q clock signals are supplied to the mixers 94 and 95 by a local oscillator circuit 96. An I signal path involving mixer 94 and a baseband filter 97 supplies an I signal stream 98 to a Block-TDM aggregator 99. A Q signal path involving mixer 95 and a baseband filter 100 supplies a Q signal stream 101 to the Block-TDM aggregator 99. Block-TDM aggregator 99 aggregates the two streams 98 and 101 into a single aggregated analog signal output stream 102. Output stream 102 is supplied via terminals 103, conductors 59 and terminals 104 to DSADC 58 in the digital baseband processor integrated circuit 53. DSADC 58 digitizes the signal 102 into a corresponding stream 105 of digital values. A Block-TDM de-aggregator 106 de-aggregates stream 105 into an I stream 107 and a Q stream 108. The I and Q streams 107 and 108 then pass to the processor of the digital baseband processor integrated circuit 53 for further processing in the digital domain. Of importance, note that there is only one ADC that digitizes analog information received from the receive chain 55. Also of importance is the fact that there is only one signal path and associated hardware conductors and terminals between the integrated circuit 52 and the integrated circuit 53 to communicate analog output signal 102 to DSADC 58.

Figure 6:
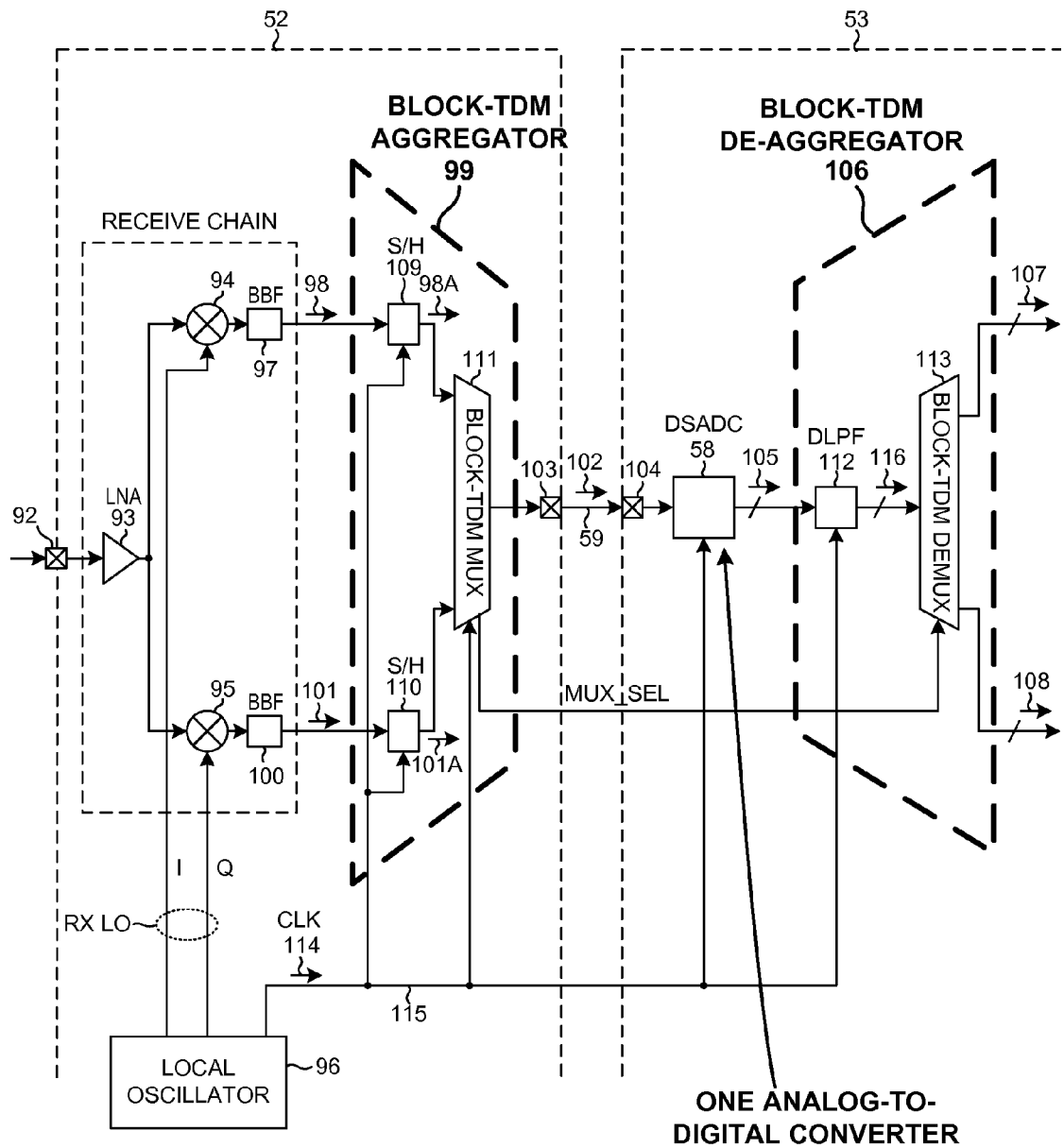
FIG. 6 is a diagram that shows the Block-TDM aggregator and the Block-TDM de-aggregator of FIG. 5 in further detail.

FIG. 6 is a diagram that shows the Block-TDM aggregator 99 and the Block-TDM de-aggregator 106 in further detail. Block-TDM aggregator 99 includes a first sampler 109, a second sampler 110, and a Block-TDM multiplexer 111. Block-TDM de-aggregator 106 includes a Digital Low Pass Filter (DLPF) 112 and a Block-TDM demultiplexer 113. Reference numeral 116 represents the filtered stream of digital values output by the digital low pass filter 112. The Block-TDM aggregator 99 and the Block-TDM de-aggregator 106 receive a clock signal CLK 114 via conductor 115 from local oscillator 96.

Figure 7:
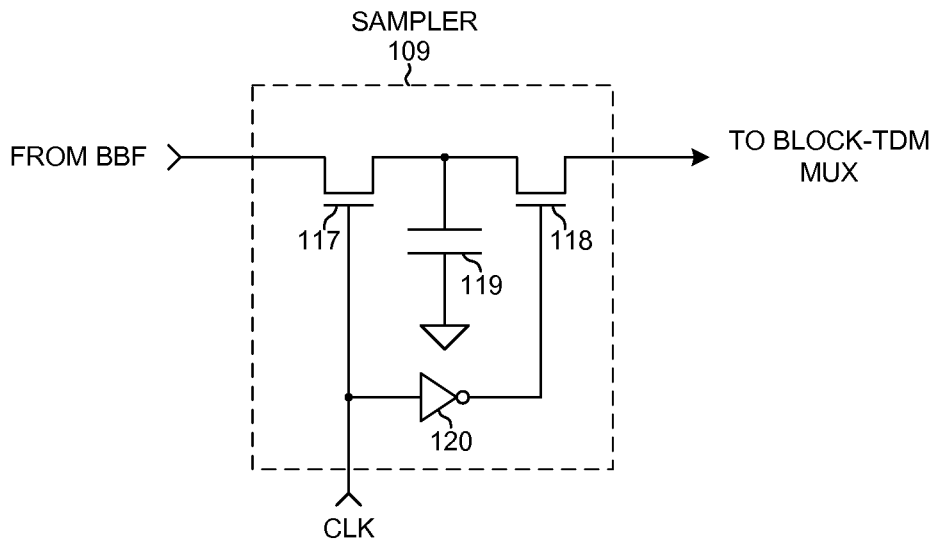
FIG. 7 is a diagram of the samplers of the Block-TDM aggregator of FIG. 6.

FIG. 7 is a simplified diagram of sampler 109. Sampler 110 is of identical construction to sampler 109. Sampler 109 includes two N-channel transistors 117 and 118, a storage capacitor 119, and an inverter 120 interconnected as illustrated. Sampler 109 is an integrating sampler. Alternatively, a non-integrating (instant) sampler can be used.

Figure 8:
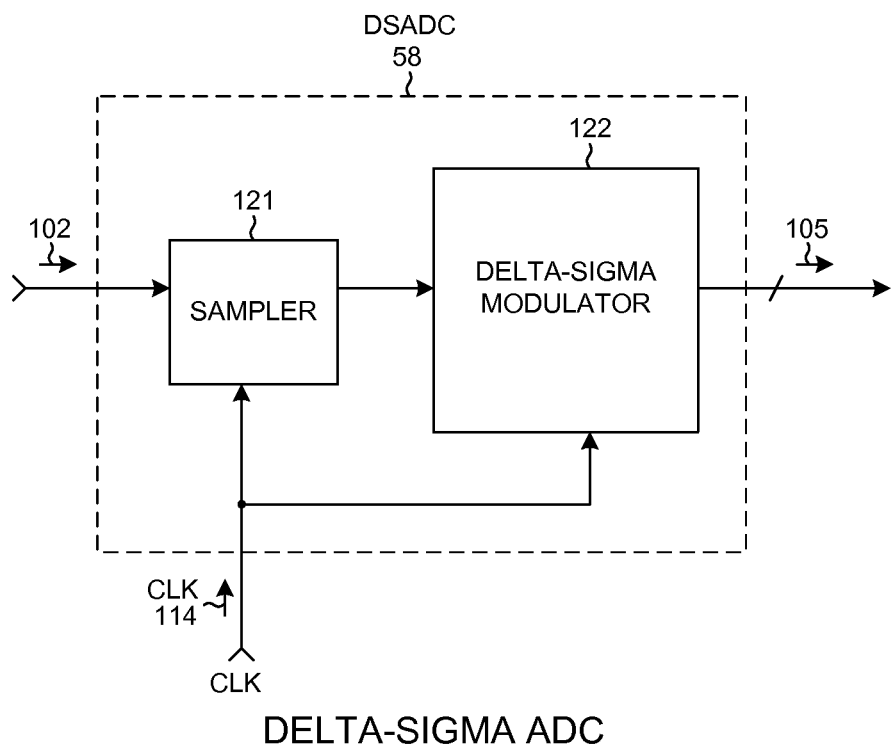
FIG. 8 is a diagram of the DSADC of FIG. 6.

FIG. 8 is a simplified diagram of a Delta-Sigma Analog-to-Digital Converter (DSADC) 58. DSADC 58 includes a sampler portion 121 and a delta-sigma modulator portion 122. DSADC 58 can be of a conventional design and construction that outputs five-bit digital values at a rate of 400M values per second (400 MHz), assuming a 40 MHz signal and an over sampling rate of ten. Notice that this is the un-decimated rate before the low pass decimating filtering following the delta-sigma modulator in a conventional design.

Figure 9:
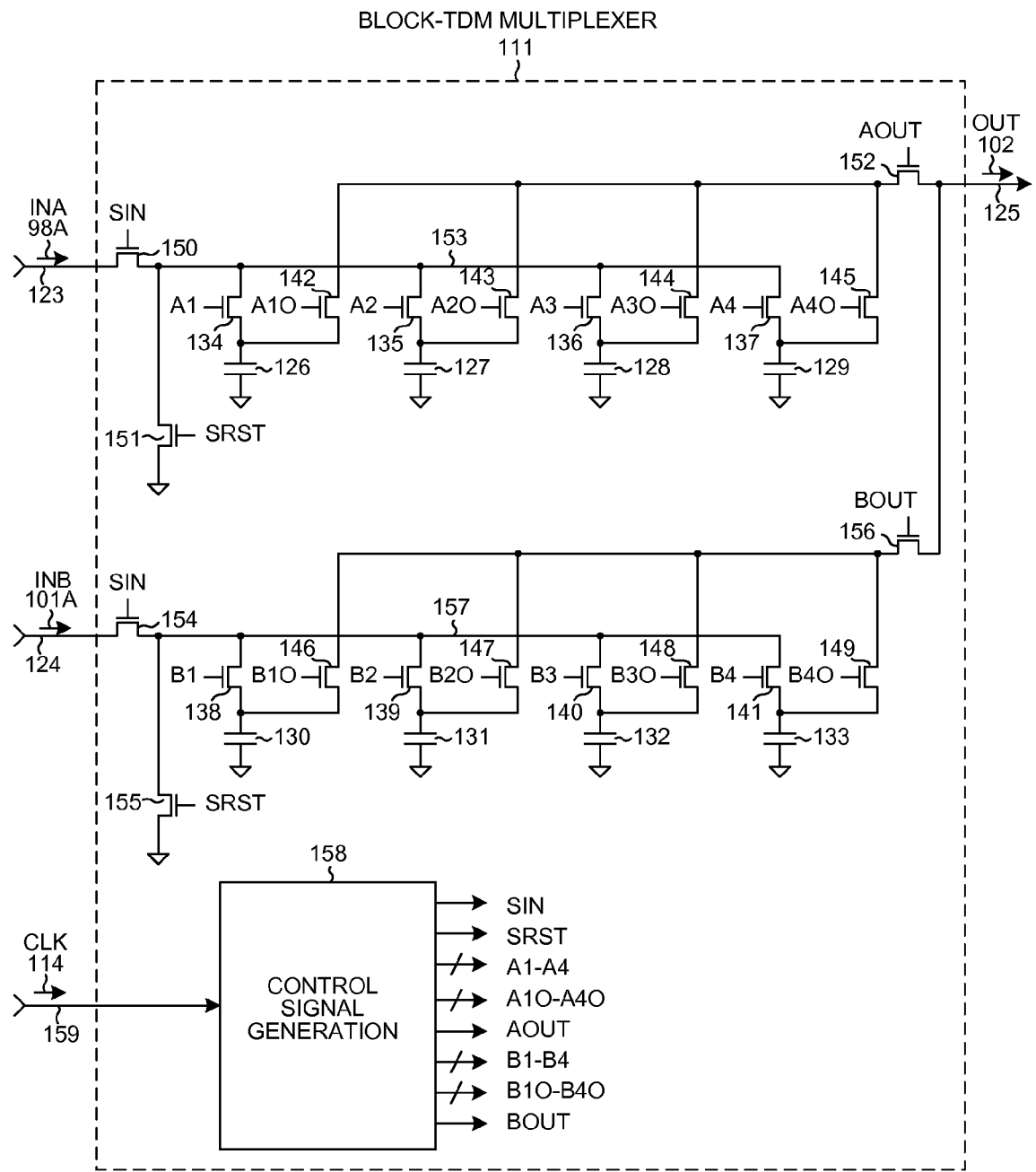
FIG. 9 is a more detailed circuit diagram of the Block-TDM multiplexer within the Block-TDM aggregator of FIG. 6.

FIG. 9 is a circuit diagram of the Block-TDM multiplexer 111 of FIG. 6. Block-TDM multiplexer 111 is a switched-capacitor circuit that receives a first input stream INA of values 98A in analog form on input lead 123 and receives a second input stream INB of values 101A in analog form on input lead 124 and outputs one aggregated output stream OUT of values 102 in analog form on output lead 125. The INA input stream 98A is a sampled version of input stream 98. The INB input stream 101A is a sampled version of input stream 101. For each incoming input stream there is a corresponding set of capacitors for temporarily storing via charge the analog voltage level of the incoming stream. Capacitors 126-129 are the set of capacitors for the first input stream INA. Capacitors 130-133 are the set of capacitors for the second input stream INB. For each capacitor there is an associated input switch typically implemented using transistor(s). This input switch is made conductive at the correct time in order to charge the capacitor to the voltage of the incoming stream (signal) in a read in operation. For each capacitor there is also an associated output switch used to couple charged capacitor to the output lead 125 in a read out operation. Switches 134-137 are the input switches for the first set of capacitors. Switches 138-141 are the input switches for the second set of capacitors. Switches 142-145 are the output switches for the first set of capacitors. Switches 146-149 are the output switches for the second set of capacitors. In addition, each set of capacitors has a signal-in switch. When this signal-in switches conductive an input lead of the Block-TDM multiplexer is coupled to a common node during a write-in operation. In addition, each set of capacitors has a reset switch for putting the voltage on the common node to a reset value, and has a signal-out switch for coupling the common node to the output lead during a read-out operation. For the first set of capacitors, switch 150 is the signal-in switch, switch 151 is the reset switch, switch 152 is the signal-out switch, and reference numeral 153 identifies the common node. For the second set of capacitors, switch 154 is the signal-in switch, switch 155 is the reset switch, switch 156 is the signal-out switch, and reference numeral 157 identifies the common node. In addition, Block-TDM multiplexer 111 includes control logic 158 that receives the clock signal CLK 114 on input lead 159 and generates therefrom control signals that control the switches of the Block-TDM multiplexer.

Figure 10:
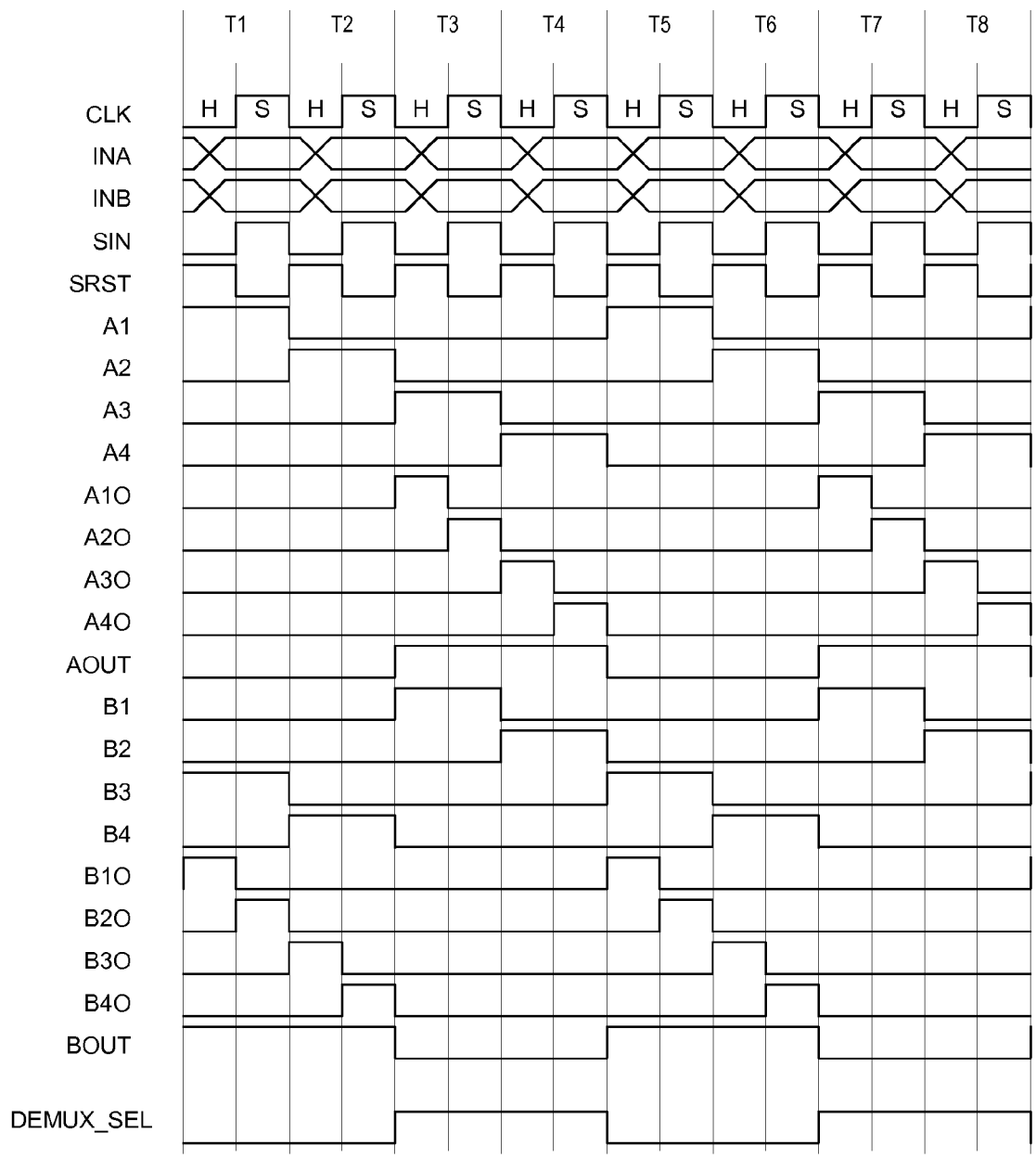
FIG. 10 is a waveform diagram that illustrates operation of the Block-TDM multiplexer of FIG. 9.

FIG. 10 is a simplified waveform diagram that illustrates operation of Block-TDM multiplexer 111. Periods of the clock signal CLK are denoted T1, T2 . . . T8 across the top of the diagram. In some periods, the input switch for a particular capacitor is made conductive so that the voltage of the input signal is stored on the capacitor. In other periods, the output switch for a particular capacitor is made conductive so that the voltage on the capacitor is coupled out to the output lead 125. Due to each capacitor having both an input switch and an output switch, the voltage of the input signal can be written into the capacitor and read out to the output lead 125 during the same period if desired. Alternatively, an input value can be stored in one capacitor of a set of capacitors in a write-in operation at the same time that another capacitor of the set of capacitors is being coupled to the output lead in a read-out operation.

Figure 11:
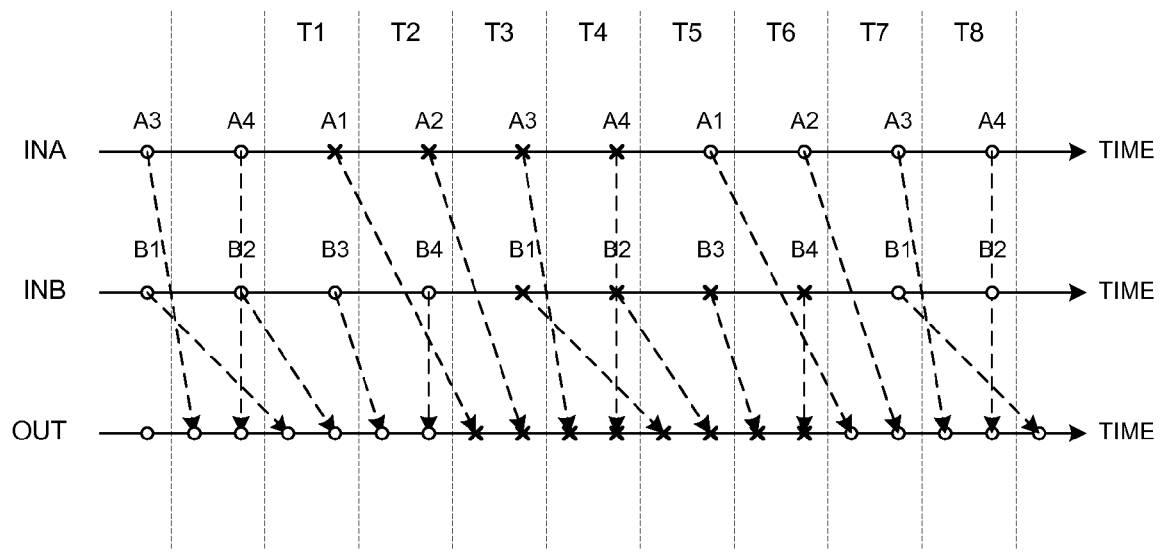
FIG. 11 is a time-line diagram that illustrates operation of the Block-TDM multiplexer of FIG. 9.

FIG. 11 is a diagram at illustrates operation of the Block-TDM multiplexer 111. This diagram describes the same operation as set forth in the waveform diagram of FIG. 10. The T1 through T8 reference numerals identify periods of the signal CLK and are the same periods as indicated by reference numerals T1 through T8 in FIG. 10. In period T1, the value of signal INA is stored in capacitor 126 as indicated by the A1 appearing in the INA row during time period T1 in the diagram of FIG. 11. In period T1, the value of the signal INB is also stored in capacitor 132 as indicated by the B3 appearing in the INB row during time period T1 in the diagram. In period T2, the value previously stored in capacitor 132 is output onto the output lead 125 as indicated by the end of the arrow extending from the B3 in the INB row. The end of this arrow terminates in the first part of time period T2 indicating that the capacitor 132 outputs its value in the first part of time period T2. In addition, in time period T2, the value of the signal INB is stored into capacitor 133 during the second part of period T2 and this value is simultaneously read out as indicated by the end of the arrow extending from the B4. The end of the arrow that extends from the B4 in the INB row terminates in the second part of the time period T2. Next, in time period T3, the value of the signal INA is stored into capacitor 128 as indicated by the A3 appearing in the INA row during time period T3. In addition, the value of the signal INB is stored into capacitor 130 as indicated by the B1 appearing in the INB row during time period T3. The arrow head that terminates in the first part of time period T3 originates in time period T1 and is identified by reference numeral A1. This indicates that readout switch 142 is made conductive so the value stored in capacitor 126 can be read out during the first part of time period T3. The arrow head that terminates in the second part of the time period T3 originates in time period T2 and is identified by reference numeral A2. This indicates that readout switch 143 is made conductive so the value stored in capacitor 127 can be read out during the second part of time period T3. This process continues as indicated by the waveforms of FIG. 10 and as indicated by the diagram of FIG. 11. The order of values output onto output lead 125 are four consecutive values from the first input signal (A1, A2, A3 and A4), and then four consecutive values from the second input signal (B1, B2, B3 and B4). One value is written into the multiplexer from each input signal during each period of CLK, but two values are output onto the output lead 125. A first value is output during the first part of the period of CLK, and a second is output during the second part of the period of CLK. The values are not output in so-called "sample interleaved" fashion with a first value from the first input signal being output, followed by a first value from the second input signal being output, followed by a second value from the first input signal being output, and so forth. Rather, blocks of multiple values of the two input signals are "block interleaved" in the time domain. A first block of multiple values (in this case four values) of the first input signal is output with the values being output consecutively in temporal order, and then a first block of multiple values (in this case four values) of the second input signal is output in the same way, and then a second block of multiple values of the first input signal is output, and so forth. This is referred to as Block-Time-Division-Multiplexing multiplexing or Block-TDM multiplexing.

Figure 12:
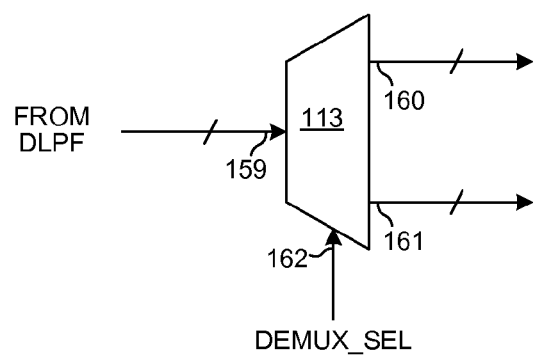
FIG. 12 is a diagram of the Block-TDM demultiplexer within the Block-TDM de-aggregator of FIG. 6.

FIG. 12 is a diagram of the Block-TDM demultiplexer 113 of FIG. 6. The demultiplexer is a set of parallel 2:1 digital logic demultiplexers. Block-TDM demultiplexer 113 receives a parallel multi-bit digital value on its input leads 159 from the digital low pass filter 112 and outputs that parallel multi-bit digital value onto a selected one of two sets of output leads 160 and 161. The digital control signal MUX_SEL on select input lead 162 is received from the control logic 158 of the multiplexer 99. This MUX_SEL signal determines onto which one of the two sets of output leads 160 and 161 the multi-bit digital value will be output. When MUX_SEL is a digital logic high, then the INA values as de-aggregated are output onto output leads 160 for the first output stream 107. When MUX_SEL is a digital logic low, then the INB values as de-aggregated are output onto output leads 161 for the second output stream 108.

In operation, the two input streams 98 and 101 of analog values are sampled and then Block-TDM aggregated in the analog domain using the switched-capacitor circuit of FIG. 9, thereby generating the single output stream 102 of aggregated analog values. This stream 102 then passes through a single set of terminals and a single set of associated conductors to the digital baseband processor integrated circuit 53. Reducing the number of terminals and conductors used to communicate the information from integrated circuit 52 to integrated circuit 53 reduces cost of the system and reduces power consumption. A single delta-sigma ADC 58 is then able to digitize the aggregated stream. Providing only a single ADC for this purpose as opposed to providing two ADC reduces power consumption considerably. Because the ADC is generally relatively large to implement in integrated circuit form, reducing the number of ADCs required from two to one serves to decrease the amount of integrated circuit area necessary to implement the circuit to a substantial degree thereby reducing manufacturing cost. As compared to the teachings of Tzeng et al. (Tzeng et al., "A CMOS Code-Modulated Path-Sharing Multi-Antenna Receiver Front-End", IEEE Journal of Solid-State Circuits, Vol. 44, No. 5, pages 1321-1335 (May 2009)) that involve using an ADC that has a flat noise spectrum characteristic, the Block-TDM aggregation method described above advantageously can use an ADC that has a non-flat noise spectrum characteristic. A delta-sigma ADC may, for example, be used and a delta-sigma ADC generally has superior resolution (i.e., signal-to-noise (SNR)) characteristics for a given amount of power consumption and a given amount of integrated circuit area as compared to types of ADCs that have flat noise spectrum characteristics. DLPF 112 is made to have a cutoff frequency that is low enough to filter out most quantization noise of the delta-sigma ADC 58 but that is high enough to allow as much signal leakage to pass through the DLPF 112 as possible. The DLPF 112 has a substantially flat magnitude frequency response and linear phase frequency response relationship in its pass band. The stream of filtered block-aggregated digital values 116 as output by DLPF 112 is then Block-TDM de-aggregated by de-multiplexer 113 into the two output streams 107 and 108.

Figure 13:
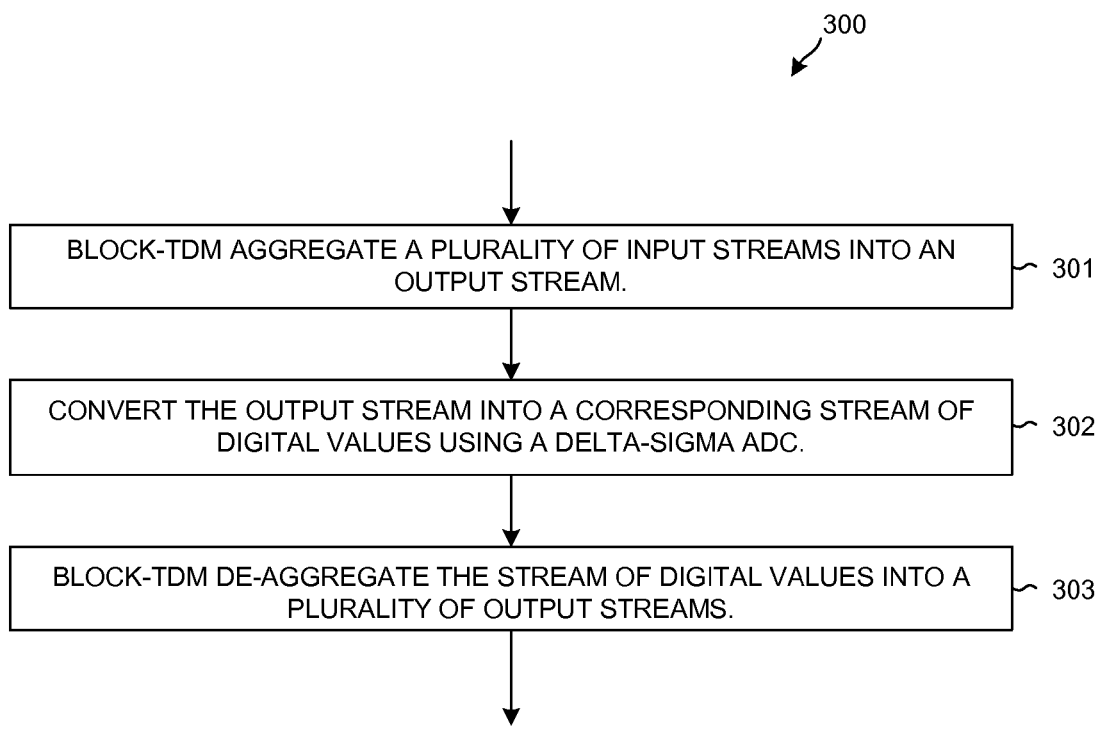
FIG. 13 is a flowchart of a generic method in accordance with the first and second novel aspects.

FIG. 13 is a high-level flowchart of a method 300 in accordance with the first and second novel aspects. In a first step (step 301), a plurality of input streams are Block-TDM aggregated into an output stream. In one example, the plurality of input streams are identified by reference numerals 98 and 101 in FIG. 6. Streams 98A and 101A of FIG. 6a can also be considered to be the plurality of input streams. In this example, the output stream is stream 102 in FIG. 6. In a second step (step 302), a Delta-Sigma ADC converts the output stream into a corresponding stream of digital values. A Block-TDM de-aggregator then de-aggregates (step 303) the stream of digital values into a plurality of output streams. In one example, streams 107 and 108 of FIG. 6 are the plurality of output streams.

Figure 14:
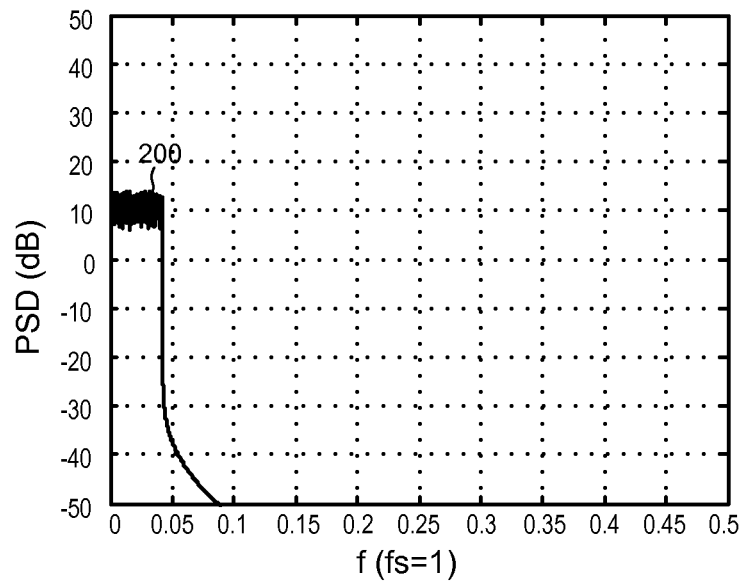
FIG. 14 is a power-spectrum-density plot of the first input stream as supplied to the circuit of FIG. 6.

FIG. 14 is a power spectrum density plot of the first input stream or signal INA 98 at the output of base band filter 97 of FIG. 6. Waveform 200 represents the first input stream INA.

Figure 15:
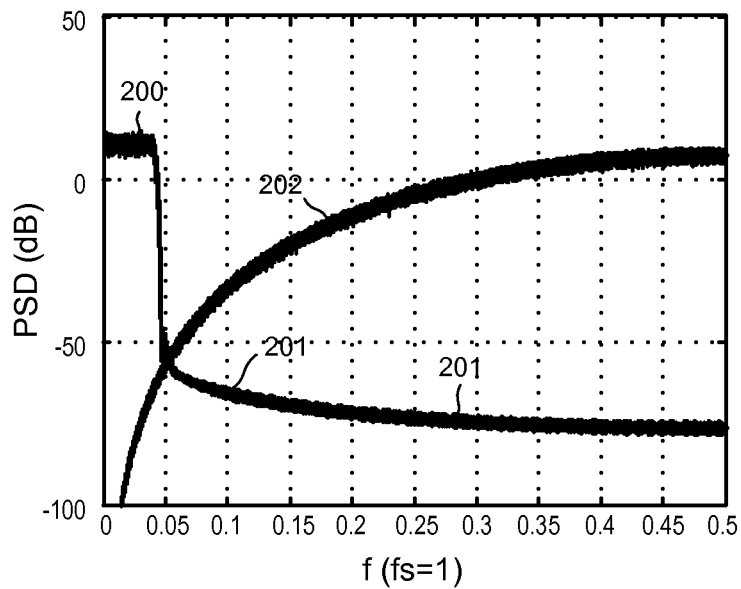
FIG. 15 is a power-spectrum-density plot of the signal as output by the DSADC of FIG. 6.

FIG. 15 is a power spectrum density plot of the stream as output by DSADC 58. Tail 201 represents signal leakage. Waveform 202 represents quantization noise due to the DSADC.

Figure 16:
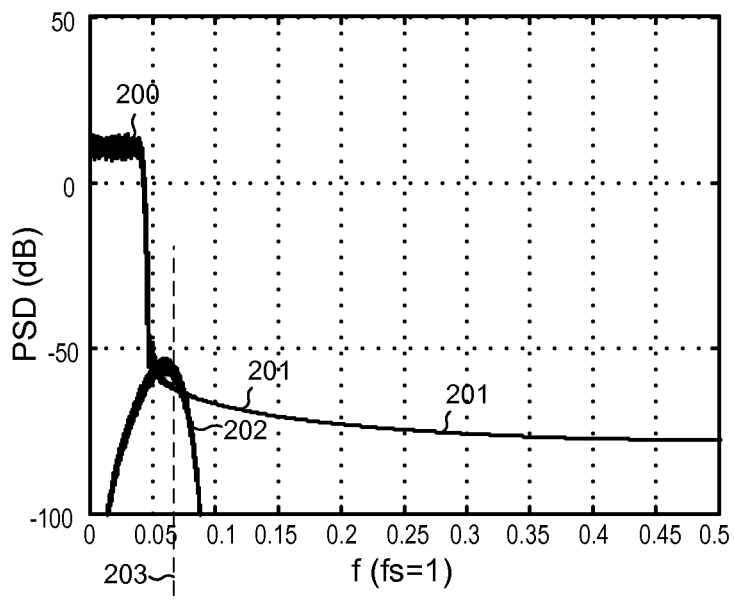
FIG. 16 is a power-spectrum-density plot of the signal at the output of the DLPF of FIG. 6.

FIG. 16 is a power spectrum density plot of the stream at the output of DLPF 112. Note that the quantization noise has largely been filtered out and removed as indicated by waveform 202, but that the signal leakage close to the signal band-edge largely remains as indicated by tail 201 (The still existing large far-end leakage is due to simulation inaccuracy. In reality, it will also be attenuated together with the far-end quantization noise). The cutoff frequency of DLPF 112 in this example was approximately 0.07 of the data rate $f_s$ of the input stream and is represented by the vertical dashed line 203.

Figure 17:
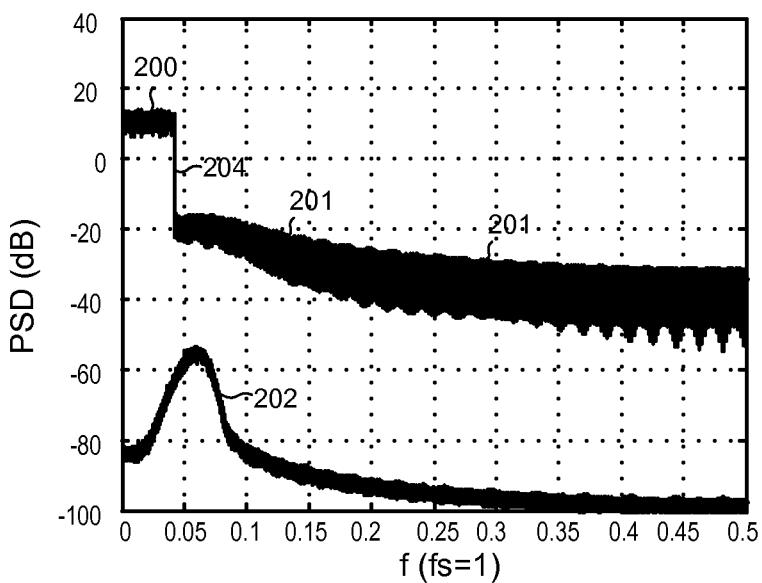
FIG. 17 is a power-spectrum-density plot of the corresponding first output stream as output by the Block-TDM de-aggregator of FIG. 6.

FIG. 17 is a power spectrum density plot of the corresponding first output stream or signal 107 after Block-TDM de-aggregating. Waveform 200 represents the signal component. The level of quantization noise 202 is low as indicated by waveform 202. As much of the signal information including the information in signal tail 201 is made to pass through to the output signal. Signal strength is high as indicated by the level of waveform 200. The amplitude of the signal has a sharp cutoff as indicated by reference numeral 204. The Block-TDM aggregation and Block-TDM de-aggregation method is somewhat imperfect in its ability to reconstruct output signals that are exactly the same as if their corresponding input signals had been processed separately by in separate signal processing paths. Where the cutoff frequency of DLPF 112 is located affects the degree of signal corruption. A TDM block size of 512 results in 31 dB signal to signal-leakage ratio (SSLR) (which is close to the LTE specification) and about 0.5 dB SQNR loss. Both SSLR and SQNR loss increase with DLPF cut-off frequency. The best trade off appears to be about 1.2× of the baseband bandwidth of the signal, influenced by other parameters such as the guard bandwidth and the close jammer specifications. In one example, time-domain windowing is performed before the de-aggregator (reciprocal de-windowing used after de-aggregation to remove Doppler spread) but before such windowing is implemented in a given design care should be taken to consider the trade-off between performance gain (usually not large) versus implementation cost.

Although there are two baseband filters 97 and 100 in two different signal paths that appear to the left of the aggregator 99 in the example of FIG. 6, in another example baseband filtering is brought into the aggregation. In this other example, there is only one baseband filter and it is disposed in the signal path after aggregator 99 between aggregator 99 and terminals 103. The two baseband filter blocks 97 and 100 are not present but rather the two signal inputs of aggregator 99 are made to receive their respective two input streams directly from the signal output leads of mixers 94 and 95, respectively.

Figure 18:
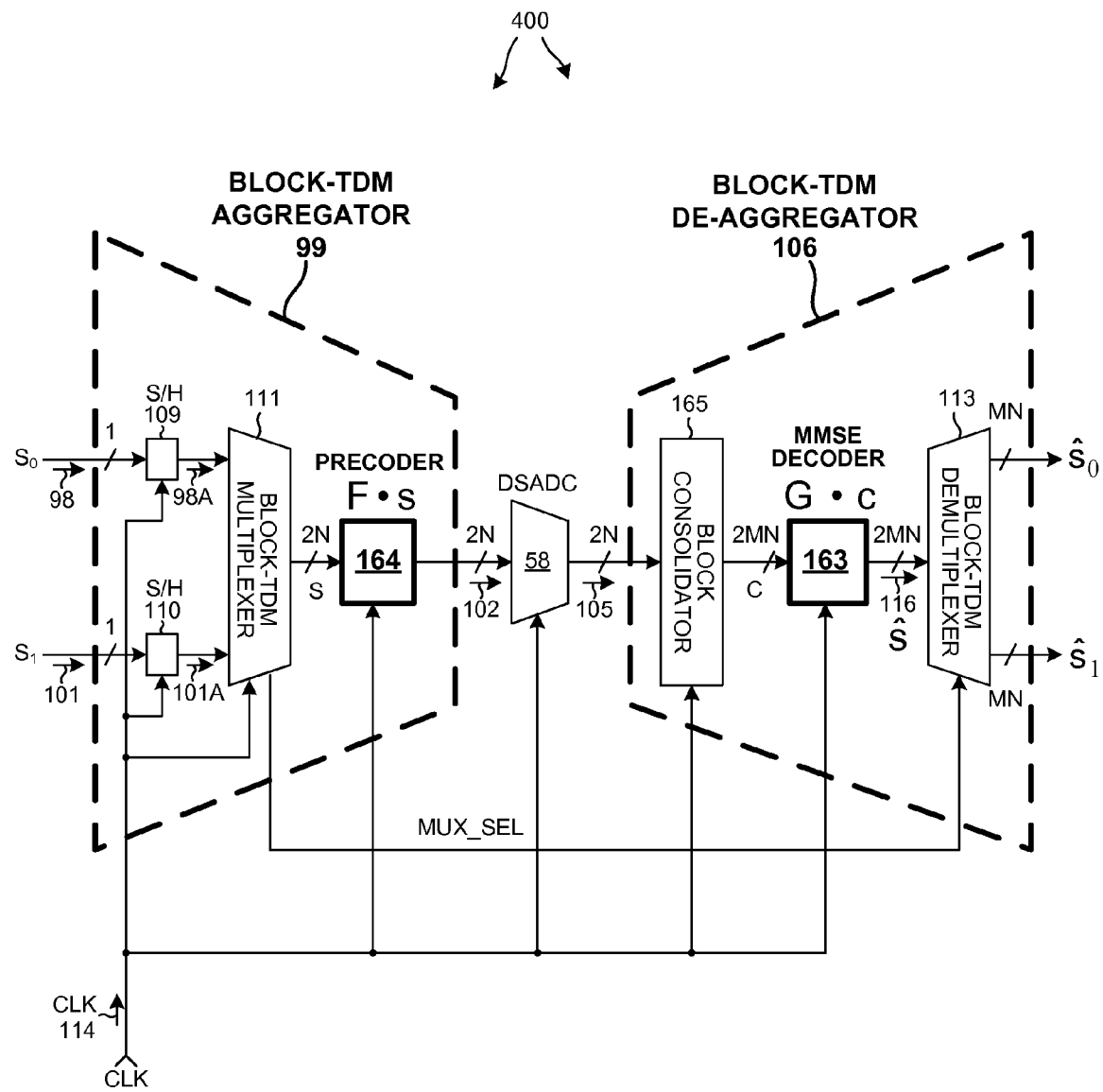
FIG. 18 is a diagram of Block-TDM aggregation and Block-TDM de-aggregation in accordance with a second novel aspect.

SECOND NOVEL ASPECT: FIG. 18 is a diagram of Block-TDM aggregation and Block-TDM de-aggregation in accordance with a second novel aspect 400. In the apparatus 400 of the second novel aspect, there is no DLPF 112 following the DSADC but rather a decoder 163 is provided. In the specific example of FIG. 17, decoder 163 is a multiple-block Minimum Mean Square Error (MMSE) decoder. Predecoder 164 is optional, as is block consolidator 165.

Figure 19:
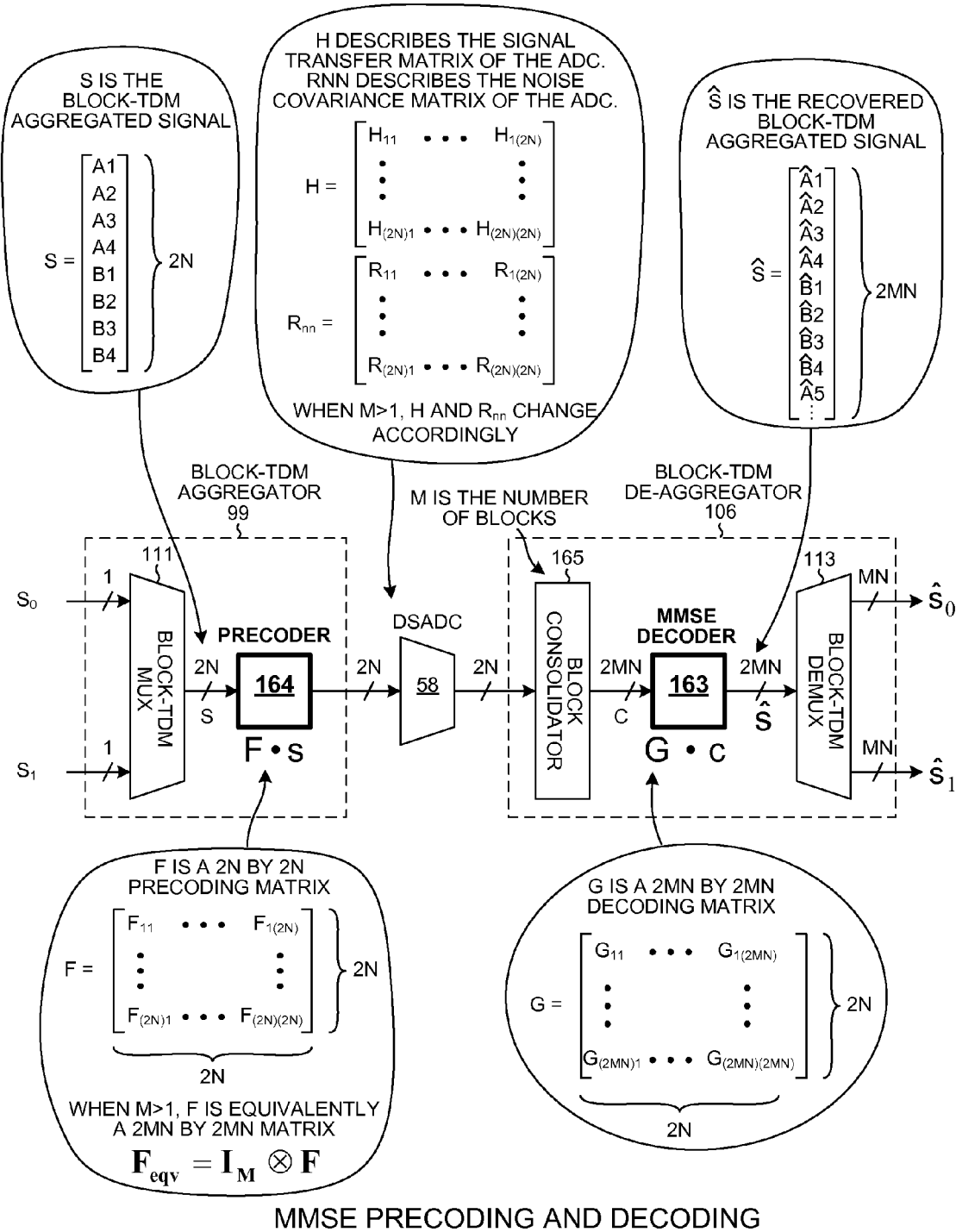
FIG. 19 is a simplified diagram that illustrates operation of the second novel aspect of FIG. 18.

FIG. 19 is a simplified diagram that illustrates operation of second novel aspect 400. In the simplified diagram, the sampling of samplers 109 and 110 is ignored and the two input streams (the streams are also referred to as signals) supplied to Block-TDM multiplexer 111 are represented by reference numerals $s_0$ and $s_1$. In a block there are N analog values. First thing to notice is that block consolidator 165 receives digital values in series from DSADC 58 and consolidates them into a signal vector of size 2 MN. Therefore, M indicates the number of multiplexed blocks s (by Block-TDM MUX 111) consolidated by the block consolidator 165.

In one scenario, M is configured to one (i.e., no block consolidation). Precoder 164 performs the matrix operation F·s, where F is a 2N by 2N precoding matrix and where s is a vector of 2N values. N of the values of the vector s are from the first input stream whereas the remaining N of the values are from the second input stream. In one example, precoder 164 is realized as an analog switch capacitor circuit and precoder 164 operates in the analog domain. H is a 2N by 2N matrix that describes the signal transfer function of DSADC 58. $R_{nn}$ is a 2N by 2N matrix that describes the noise covariance of DSADC 58. Block consolidator 165 does not take effect in this case, since M equals to one. MMSE decoder 163 performs the matrix operation G·c in the digital domain, where G is a 2N by 2N decoding matrix of digital values, and where c is a vector of the stream values as received from block consolidator 165. The output of MMSE decoder 163 is denoted ŝ. In the notation used in FIG. 19, the four A values with the hat symbol over them in the ŝ vector indicate the four recovered signal values from the first input stream $s_0$ whereas the four B values with the hat symbol over them indicate the four recovered signal values from the second input stream $s_1$.

In another scenario, M is configured to larger than one. Precoder 164 performs the same analog operation as set forth above (i.e., still using N as the block size), while F (corresponding to M blocks now) is equivalent to a 2 MN by 2 MN precoding matrix as further described in step 503 in FIG. 20. H and $R_{nn}$ are also made equivalent to 2 MN by 2 MN matrices as further described in step 501 in FIG. 20. Block consolidator 165 receives digital values in series from DSADC 58 and consolidates them into a signal vector of size 2 MN. MMSE decoder 163 performs the matrix operation G·c in the digital domain, where G is a 2 MN by 2 MN decoding matrix of digital values, and where c is a vector of the stream values as received from block consolidator 165.

Block consolidator 165, MMSE decoder 163 and Block-TDM demultiplexer 113 in one example is an amount of dedicated digital logic circuitry. The digital logic circuitry is realized by describing the functions of blocks 165, 163 and 113 in a hardware description language such as Verilog or VHDL, and then using a commercially available digital logic synthesis tool to generate a circuit description of the dedicated logic circuitry that can then be fabricated. In another example, blocks 165, 163 and 113 are implemented by a vector processing engine of a DSP (Digital Signal Processor) portion of the digital baseband processing integrated circuit 53. In other examples, the functionality of blocks 165, 163 and 113 is implemented in software or in a combination of software and hardware.

Figure 20:
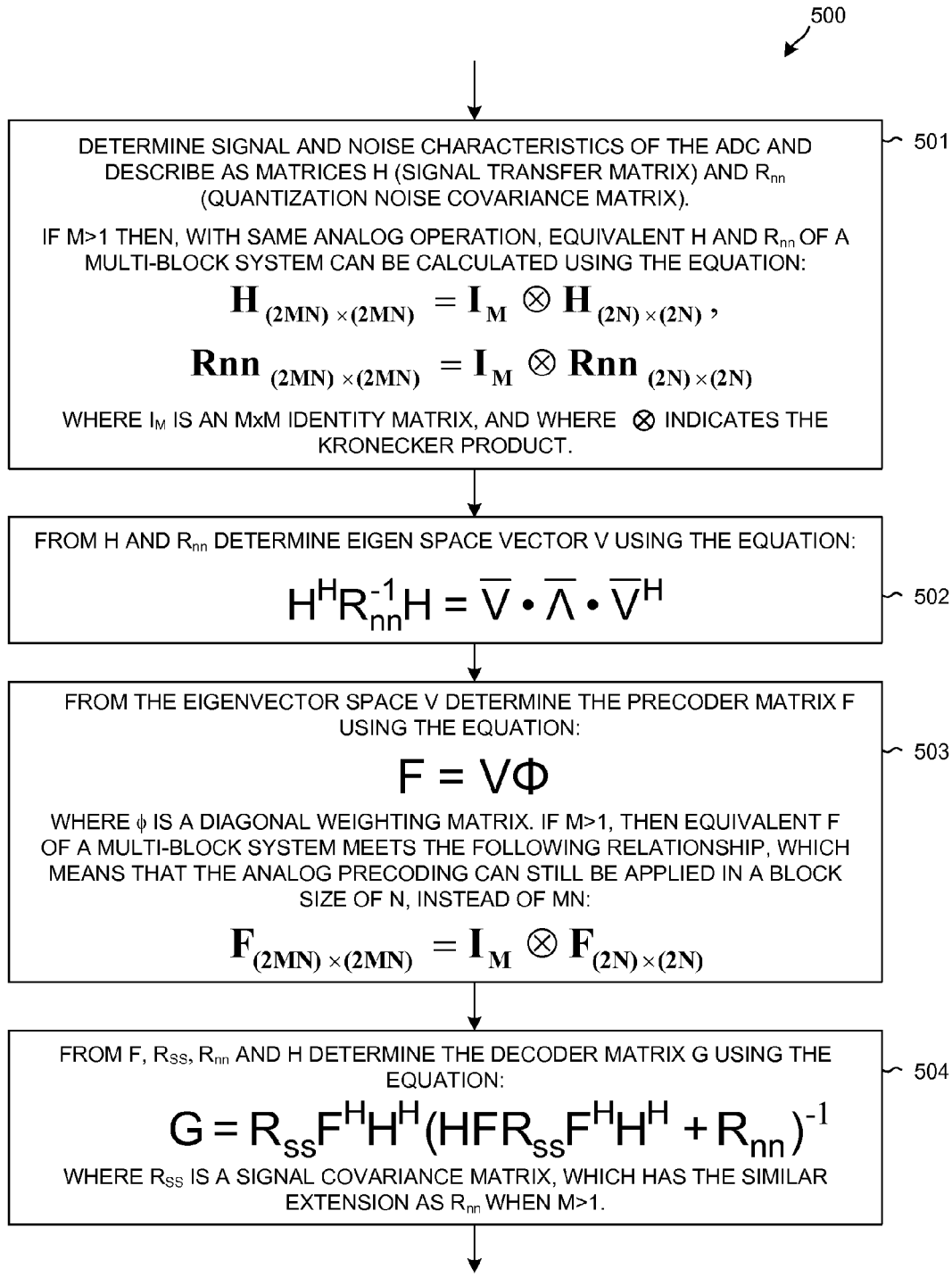
FIG. 20 is a simplified flowchart of a method of determining F and G for use in carrying out the second novel aspect of FIG. 18.

The matrices F and G are determined prior to operation of the aggregation and de-aggregation circuitry so that blocks 164 and 163 have use of these matrices when the blocks 164 and 163 are processing signal data. FIG. 20 is a simplified flowchart of a method 500 of determining F and G. In step 501, signal transfer function and noise characteristics of DSADC 58 are determined and are described as matrices H and $R_{nn}$. Any one of many known ways of characterizing the transfer function of the channel between the aggregator and de-aggregator (through DSADC 58 in this example) can be employed as is known in the precoding/decoding arts. In step 502, the Eigen space vector V is determined using H and $R_{nn}$ using the equation set forth in block 502 of FIG. 20. Next in step 503 the Eigenvector space V is used to determine the precoder matrix F as set forth in block 503 of FIG. 20. The matrix Φ is a diagonal matrix used to set the weights of the various Eigenvector. Next in step 504 the decoder matrix G is determined from F, $R_{ss}$ and $R_{nn}$, where $R_{ss}$ is a signal covariance matrix. Once the matrices F and G are determined off-line in this way, they can then be used by the aggregating and de-aggregating circuitry of FIG. 18 to process signal data. In one example, the F and G matrices are determined by processor 60 of FIG. 4 as a result of executing program 61 of processor-executable instructions, and once the numbers in the F matrix are determined they are communicated under software control via serial bus 65 to RF transceiver integrated circuit 52 for use by aggregating circuitry in the RF transceiver integrated circuit 52.

When DSADC 58 operates it injects unwanted quantization noise into the data-to-be-digitized and the injection of this noise can be characterized as following certain axes in Eigen space. The noise injection characteristics of the DSADC can therefore be characterized and represented in Eigen space. The precoder transforms the aggregated data along axes in "time space" into the noise-generating "Eigen space" axes of the DSADC and weights the signal appropriately (larger weights are assigned to signal Eigen vectors that have smaller Eigen values of quantization noise) so that the aggregated data going into the DSADC is made less susceptible to the noise-generating characteristics of the DSADC. For additional background information on F precoder matrices, G decoder matrices, and how these F and G matrices can be generated using channel characteristic information, see: Scaglione et al., "Optimal Designs for Space-Time Linear Precoders and Decoders", IEEE Transactions on Signal Processing, Vol. 50, No. 5, pages 1051-1064 (May 2002).

Figure 21:
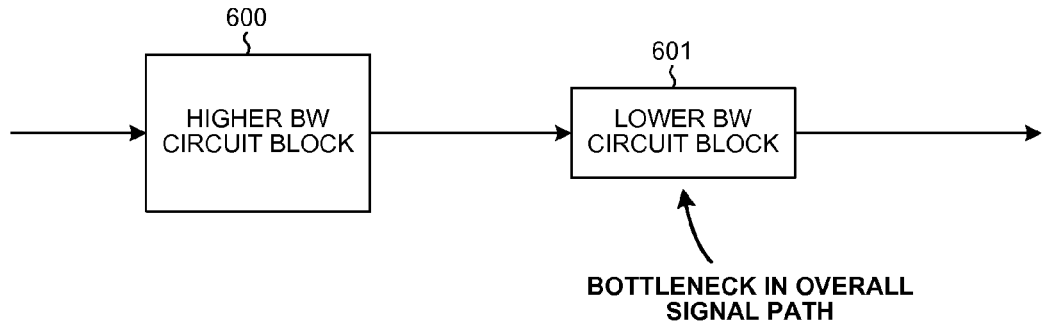
FIG. 21 is a diagram that shows a problem solved by employing a third novel aspect.

THIRD NOVEL ASPECT: FIG. 21 is a diagram that shows a problem solved in accordance with a third novel aspect. A signal path extends through a first circuit 600 that has a higher bandwidth throughput capability and then extends through a second circuit 601 that has a lower bandwidth throughput capability. Overall signal path throughput through the overall combined circuit is limited by the bottleneck of the lower bandwidth second circuit 601. This bottleneck is to be removed.

Figure 22:
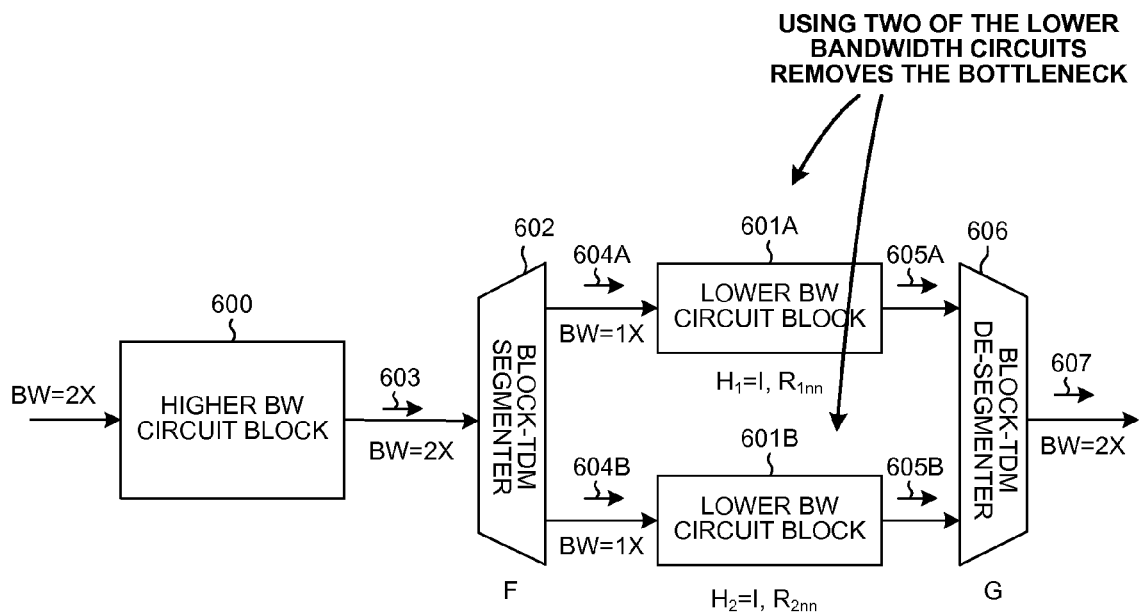
FIG. 22 is a diagram of a circuit in accordance with the third novel aspect.

FIG. 22 is a diagram of a circuit in accordance with the third novel aspect. The circuit solves the bottleneck problem of FIG. 21. Rather that using only one of the second circuits to process all the signal passing through the higher bandwidth first circuit 600 as illustrated in FIG. 21, two instances 601A and 601B of the second circuit are provided. A Block-TDM segmenter 602 performs block-TDM segmentation on values of the single stream 603 as output by the first circuit 600 thereby generating two sub-streams 604A and 604B. Values from the single stream 603 are not "sample-interleaved" into the two sub-streams. Rather, a sequence of consecutive values (a "block" of values) of stream 603 is de-multiplexed into the first sub-stream 604A, and then the next sequence of consecutive values (a second "block" of values) is de-multiplexed into the second sub-stream 604B. This de-multiplexing process is repeated from block to block of values of the single stream 603 such that half of the values of stream 603 pass to the first instantiation of the lower bandwidth circuit 601A and such that the other half of the values of stream 603 pass to the second instantiation of the lower bandwidth circuit 601B.

After processing by the two lower bandwidth circuits 601A and 601B, the resulting processed sub-streams 605A and 605B are Block-TDM de-segmented by Block-TDM de-segmenter 606 into a single output stream 607. The BW=2X label on the input of the higher bandwidth first circuit 600 at the left of the diagram and the BW=2 label on the output of the Block-TDM de-segmenter 606 at the right of the diagram indicate that the number of values per unit time passing into and out of the circuit through these paths is identical and is twice as great as the BW-1X throughput passing through each of the two lower bandwidth circuits 601A and 601B.

In one example, Block-segmenter 602 performs precoding as indicated by the label F, and the Block-TDM de-segmenter 606 performs decoding as indicated by the label G. Precoding matrix F and decoding matrix G are appropriate for the equivalent total channel characteristics of the circuit 601A, as described by the $H_1$ and $R_{1nn}$ matrices, and the circuit 601B, as described by the $H_2$ and $R_{2nn}$ matrices.

Figure 23:
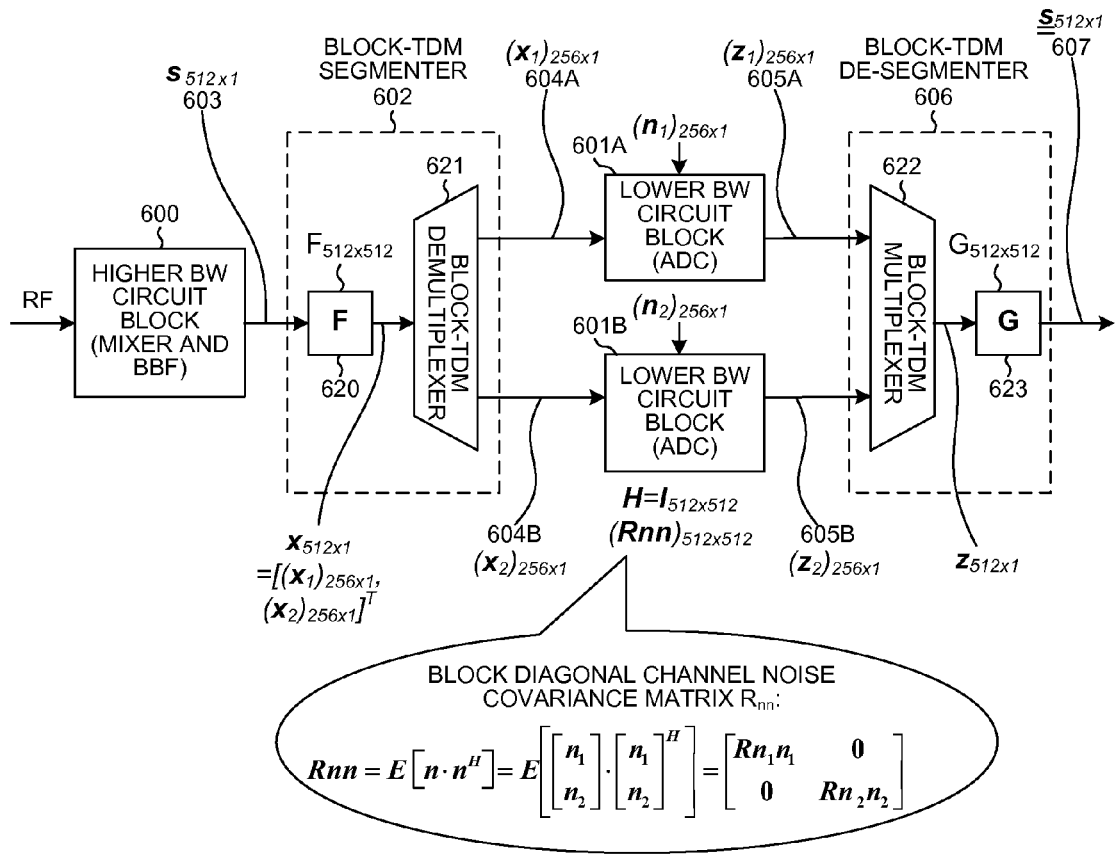
FIG. 23 is a diagram that shows the Block-TDM segmenter and the Block-TDM de-segmenter of FIG. 22 in further detail.

FIG. 23 is a diagram that shows Block-TDM segmenter 602 and Block-TDM de-segmenter 606 in further detail. Block-TDM segmenter 602 includes a precoder F 620 and a Block-TDM demultiplexer 621. Block-TDM de-segmenter 606 includes a Block-TDM multiplexer 622 and a decoder G 623. As explained above, F and G are employed when processing values from s to s. The method described above in connection with FIG. 20 is employed to determine F and G. Specifically, H equals to block-diagonal ($H_1$, $H_2$). When $H_1$ equals to $H_2$, H equals to $I_2 \otimes H_1$, similar to the description in FIG. 20. The same can be applied for generating Rss and Rnn. H and $R_{nn}$ are used to calculate F. F, H, $R_{ss}$, and $R_{nn}$ are used to determine G. Notice that F is a block diagonal matrix, thus simplifying its analog implementation. In some examples, an additional block consolidator is provided between the output of the Block-TDM multiplexer and decoder block G in the Block-TDM de-segmenter 606. Again, notice that F is still a block diagonal matrix, thus simplifying its analog implementation. If less accuracy is required, then precoding and decoding need not be used but rather a Digital Low Pass Filter (DLPF) is used in the Block-TDM de-segmenter 606 in place of decoder G.

Block-TDM de-segmenter 606 also typically includes a buffer or buffers (not shown) to buffer incoming digital values from second circuits 601A and/or 601B. For example, digital values A1 and A2 may be received in sequence from circuit 601A whereas digital values A3 and A4 may be received in sequence from circuit 601B. The Block-TDM multiplexer of the Block-TDM de-segmenter 606 is to output the digital values to the decoder in the order A1, A2, A3 and A4 but the multiplexer receives the digital values A1 and A3 during a first time period and receives the digital values A2 and A4 later during a second time period. The A3 digital value is therefore stored in a buffer until the A2 digital value is received so that the A2 digital value can be output from the multiplexer before the A3 digital value is output. The buffer that stores the A2 digital value in this way is implemented as a digital register that holds one digital value or as a small FIFO (First In First Out) buffer that stores several digital values. Both input streams coming into the Block-TDM de-segmenter 606 may be buffered.

Figure 24:
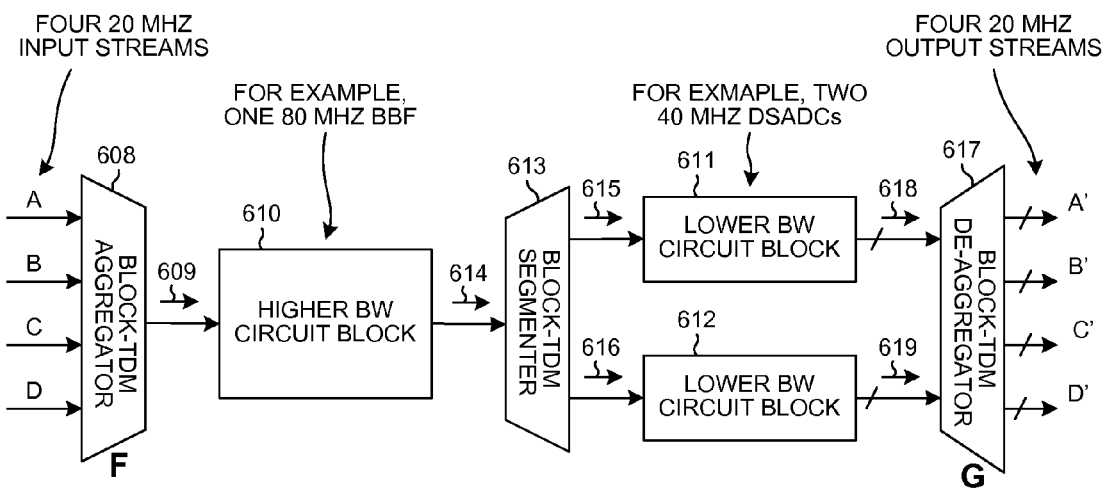
FIG. 24 is a diagram of an example of simultaneously employing Block-TDM aggregation and Block-TDM segmentation.

FIG. 24 is a diagram of a simplified example of simultaneously employing Block-TDM aggregation and Block-TDM segmentation. Four incoming signal streams A, B, C and D are Block-TDM aggregated by aggregator 608 into a single aggregated stream 609 that is processed by the higher bandwidth circuit 610. In this simplified example, each of the incoming streams has a bandwidth of 20 MHz and the higher bandwidth circuit 610 has a bandwidth of 80 MHz, so the single circuit 610 can handle the combined 80 MHz throughput. In this example, the higher bandwidth circuit 610 is a baseband filter (BBF) and signals A and B are quadrature mixer output signals from a first receive chain and C and D are quadrature mixer output signals from a second receive chain. Each of the DSADCs 611 and 612 only has a 40 MHz bandwidth. Accordingly, a single DSADC cannot handle the total throughput passing through the higher bandwidth baseband filter circuit 610. Block-TDM segmenter 613 is therefore provided to block-TDM segment the 80 MHz stream 614 into two 40 MHz sub-streams 615 and 616. A separate DSADC digitizes each of the two sub-streams. A Block-TDM de-aggregator 617 de-aggregates the substream 618 of digital values output by DSADC 611 into two streams A' and B', where A' is the recovered version of A, and where B' is the recovered version of B. Similarly, Block-TDM de-aggregator 617 also de-aggregates the sub-stream 619 output by DSADC 612 into two streams C' and D', where C' is the recovered version of C, and where D' is the recovered version of D. The CLK signal and the MUX_SEL signals and other control signals are not shown in order to simplify the diagram.

Block-TDM segmenter 613 operates in the analog domain on analog values. In one example, Block-TDM segmenter 613 involves an analog demultiplexer that couples each incoming analog voltage level value onto a selected one of two sets of capacitors. A block of consecutive analog voltage level values of stream 614 is stored in one set of capacitors as a set of voltage levels, and the voltage levels stored in these capacitors are then read out and are supplied to the appropriate DSADC at a data rate that is half the date rate of voltage level values received by Block-TDM segmenter 613. After this first block of consecutive analog voltage level values has been stored in this one set of capacitors, a second block of consecutive analog voltage level values from stream 614 is stored in the capacitors of the second set of capacitors. The voltage levels stored in the capacitors of this second set are then read out and are supplied to the second DSADC 612 at the lower data rate.

In one example, each vector of the stream 609 corresponds to a combination of a vector of stream 618 and a vector of stream 619. Operation of the signal path involving blocks 610, 613, 611 and 612 is described in terms of H and $R_{nn}$ as explained above. H and $R_{nn}$ are then used to determine the matrices G and H used by the decoder in de-aggregator 617 and by the precoder in aggregator 608, respectively.

Figure 25:
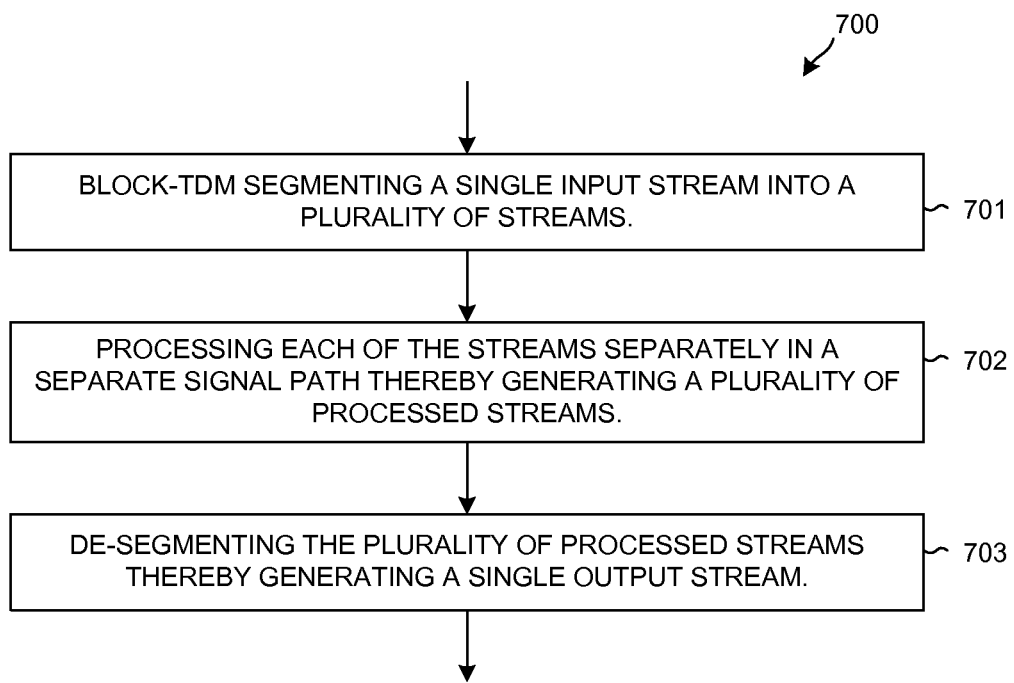
FIG. 25 is a flowchart of a method 700 in accordance with the third novel aspect.

FIG. 25 is a flowchart of a method 700 in accordance with the third novel aspect. A single input stream is Block-TDM segmented (step 701) into a plurality of streams. In one example, Block-TDM segmenter 602 of FIG. 23 performs this segmenting and thereby generates the two streams $x_1$ and $x_2$ illustrated in FIG. 23. Each of the plurality of streams is processed separately (step 702) in a separate signal path thereby generating a plurality of processed streams. In on example, block 601A of FIG. 23 processes the first stream thereby generating the processed stream $z_1$ and block 601B processes the second stream thereby generating the processed stream $z_2$. The plurality of processed streams are Block-TDM de-segmented (step 703) into a single output stream. In one example, Block-TDM de-segmenter 606 performs this de-segmentation operation on processed streams $z_1$ and $z_2$ thereby generating the single output stream s.

Although certain specific embodiments are described above for instructional purposes, the teachings of this patent document have general applicability and are not limited to the specific embodiments described above. The structures and methods of the first, second and third novel aspects are advantageously applied to advanced wireless communication systems such as to MIMO LTE-A radios. The structures and methods are not, however, limited to use in MIMO LTE-A radios, but rather see general applicability. Accordingly, various modifications, adaptations, and combinations of the various features of the described specific embodiments can be practiced without departing from the scope of the claims that are set forth below.

What is claimed is:

1. A method comprising:
   (a) Block-Time-Division-Multiplexing (Block-TDM) aggregating blocks of multiple values of a plurality of input signal streams into an output stream, each block comprising multiple values obtained during consecutive time periods from one of the input signal streams;
   (b) using a Delta-Sigma Analog-to-Digital Converter (DSADC) to convert the output stream into a corresponding stream of digital values; and
   (c) Block-TDM de-aggregating the stream of digital values into a plurality of output streams.

2. The method of claim 1, wherein the Block-TDM aggregating of (a) involves using an analog switched-capacitor multiplexer circuit that receives the plurality of input signal streams and that outputs the output stream.

3. The method of claim 1, wherein the Block-TDM aggregating of (a) is done in the analog domain before digitizing of the output stream by the DSADC in (b).

4. The method of claim 1, wherein each of the input signal streams involves a plurality of values, wherein each of the values is represented by a corresponding analog voltage level, wherein each of the analog voltage levels is stored onto a corresponding one of a plurality of capacitors in a Block-TDM aggregator circuit and is read out from the corresponding one of the capacitors onto an output lead of the Block-TDM aggregator circuit so that at most one of the analog voltage levels is present on the output lead at a time.

5. The method of claim 1, wherein the Block-TDM aggregating of (a) involves:
   aggregating the plurality of input signal streams into an aggregated stream; and
   performing a precoding transformation on the aggregated stream and thereby generating the output stream.

6. The method of claim 5, wherein the performing of the precoding transformation is performed in the analog domain using a switched-capacitor precoder circuit.

7. The method of claim 1, wherein the Block-TDM aggregating of (a) involves aggregating the plurality of input signal streams into the output stream and supplying the output stream to the DSADC without performing any precoding.

8. The method of claim 1, wherein the Block-TDM de-aggregating of (c) involves:
   performing a decoding transformation on the stream of digital values and thereby generating a decoded aggregated stream of digital values; and
   de-multiplexing the decoded aggregated stream of digital values and thereby generating the plurality of output streams.

9. The method of claim 1, wherein the Block-TDM de-aggregating of (c) involves:
   supplying the output stream of digital values to a block consolidator;
   performing a decoding transformation on an output of the block consolidator and thereby generating a decoded aggregated stream of digital values; and
   de-multiplexing the decoded aggregated stream of digital values and thereby generating the plurality of output streams.

10. The method of claim 1, wherein the Block-TDM de-aggregating of (c) involves:
    passing the output stream of digital values through a Digital Low Pass Filter (DLPF) and thereby generating a stream of filtered digital values; and
    de-multiplexing the stream of filtered digital values and thereby generating the plurality of output streams.

11. The method of claim 1, wherein a first of the input signal streams of (a) is an input signal stream corresponding to a first antenna of a radio receiver, and wherein a second of the input signal streams of (a) is an input signal stream corresponding to a second antenna of the radio receiver.

12. The method of claim 11, wherein the first antenna is a first antenna of multi-antenna radio receiver, and wherein second antenna is a second antenna of the multi-antenna radio receiver.

13. The method of claim 1, wherein a first of the input signal streams of (a) is an input signal stream corresponding to a first frequency carrier, and wherein a second of the input signal streams of (a) is an input signal stream corresponding to a second frequency carrier.

14. The method of claim 13, wherein the first frequency carrier is a first Long Term Evolution (LTE) carrier, and wherein the second frequency carrier is a second LTE carrier.

15. The method of claim 1, wherein a first of the input signal streams of (a) is an In-phase (I) input signal stream that is output by a quadrature mixer of a receiver, and wherein a second of the input signal streams of (a) is Quadrature phase (Q) input signal stream that is output by the quadrature mixer of the receiver.

16. The method of claim 1, further comprising:
    performing baseband filtering on the aggregated output stream so that the output stream that is converted by the DSADC is a baseband filtered output stream.

17. The method of claim 16, wherein (a) involves receiving each of the plurality of input signal streams from a corresponding sampler without the input signal stream being baseband filtered before being Block-TDM aggregated in (a).

18. The method of claim 1, wherein (a) involves receiving each of the plurality of input signal streams onto a Block-TDM aggregator from a separate baseband filter.

19. The method of claim 1, wherein each of the plurality of input signal streams has been baseband filtered before being Block-TDM aggregated in (a).

20. The method of claim 1, wherein a first of the input signal streams is received on a first antenna and passes through a portion of a receiver and is supplied to a Block-TDM aggregator that performs the Block-TDM aggregating of (a) such that information carried by the first input signal stream is communicated in the output stream to the DSADC, wherein a second of the input signal streams is received on a second antenna and passes through the portion of the receiver and is supplied to the Block-TDM aggregator that performs the Block-TDM aggregating of (a) such that information carried by the second input signal stream is communicated in the output stream to the DSADC, and wherein the output stream is communicated from a first integrated circuit that includes the Block-TDM aggregator to a second integrated circuit that includes the DSADC.

21. An apparatus comprising:
    a Block-Time-Division-Multiplexing (Block-TDM) aggregator that aggregates blocks of multiple values of a plurality of input signal streams into an output stream, each block comprising multiple values obtained during consecutive time periods from one of the input signal streams;
    a Delta-Sigma Analog-to-Digital Converter (DSADC) that converts the output stream into a corresponding stream of digital values; and
    a Block-TDM de-aggregator that de-aggregates the stream of digital values into a plurality of output streams.

22. The apparatus of claim 21, wherein the Block-TDM aggregator comprises:
a Block-TDM multiplexer that aggregates the plurality of input signal streams into an aggregated stream; and
a precoder that receives the aggregated stream and outputs the output stream.

23. The apparatus of claim 21, wherein the Block-TDM de-aggregator comprises:
a decoder that receives the stream of digital values and outputs a decoded aggregated stream of digital values; and
a Block-TDM de-multiplexer that receives the decoded aggregated stream of digital values and outputs the plurality of output streams.

24. The apparatus of claim 21, wherein the Block-TDM de-aggregator comprises:
a block consolidator that receives the stream of digital values from the DSADC and that outputs a stream of consolidated digital values;
a decoder that receives the stream of consolidated digital values from the block consolidator and that outputs a decoded aggregated stream of digital values; and
a Block-TDM de-multiplexer that receives the decoded aggregated stream of digital values and outputs the plurality of output streams.

25. The apparatus of claim 21, wherein the Block-TDM de-aggregator comprises:
a Digital Low Pass Filter (DLPF) that receives the stream of digital values from the DSADC and that outputs a stream of filtered digital values; and
a Block-TDM de-multiplexer that receives the stream of filtered digital values and that outputs the plurality of output streams.

26. The apparatus of claim 21, wherein the Block-TDM aggregator includes a plurality of capacitors, wherein each of the input signal streams involves a plurality of values, wherein each of the values is represented by a corresponding analog voltage level, wherein each of the analog voltage levels is stored onto a corresponding one of the plurality of capacitors and is read out from the corresponding one of the capacitors onto an output lead of the Block-TDM aggregator circuit so that at most one of the analog voltage levels is present on the output lead at a time.

27. An apparatus comprising:
a Delta-Sigma Analog-to-Digital Converter (DSADC); and
means for Block-Time-Division-Multiplexing (Block-TDM) aggregating blocks of multiple values of a plurality of input signal streams into an aggregated stream and for supplying the aggregated stream to the DSADC, each block comprising multiple values obtained during consecutive time periods from one of the input signal streams.

28. The apparatus of claim 27, further comprising:
means for Block-TDM de-aggregating a stream of digital values output by the DSADC into a plurality of output streams of digital values.

29. The apparatus of claim 27, wherein the means for Block-TDM aggregating is for Block-TDM multiplexing the plurality of input signal streams into an aggregated stream and is also for precoding the aggregated stream and thereby generating the aggregated stream that is supplied to the DSADC.

30. The apparatus of claim 27, wherein the means for Block-TDM aggregating includes a Block-TDM multiplexer but does not include a precoder.

31. The apparatus of claim 28, wherein the means for Block-TDM de-aggregating is also for low pass filtering the stream of digital values output by the DSADC and thereby generating a stream of filtered digital values, and wherein the means for Block-TDM de-aggregating is also for Block-TDM demultiplexing the stream of filtered digital values and thereby generating the plurality of output streams of digital values.

32. The apparatus of claim 28, wherein the means for Block-TDM de-aggregating is also for decoding the stream of digital values output by the DSADC and thereby generating a decoded aggregated stream of digital values, and wherein the means for Block-TDM de-aggregating is also for Block-TDM demultiplexing the decoded aggregated stream of digital values thereby generating the plurality of output streams of digital values.

33. A method comprising:
Block-Time-Division-Multiplexing (Block-TDM) segmenting an input stream into a plurality of streams, the input stream comprising blocks of values, each block of values being a sequence of consecutive values of the input stream, said segmenting the input stream including segmenting a first block of values into one of the plurality of streams and the next block into a different one of the plurality of streams.

34. The method of claim 33, further comprising:
passing a first of the plurality of streams through a first signal processing path and thereby generating a first processed stream;
passing a second of the plurality of streams through a second signal processing path and thereby generating a second processed stream; and
Block-TDM de-aggregating the first and second processed streams and thereby generating more than two output streams.

35. The method of claim 34, wherein the Block-TDM de-aggregating involves performing a decoding operation and performing a Block-TDM de-multiplexing operation.

36. A method comprising:
(a) Block-Time-Division-Multiplexing (Block-TDM) segmenting an input stream into a first stream and a second stream, the input stream comprising blocks of values, each block of values being a sequence of consecutive values of the input stream, wherein segmenting the input stream comprises including a first block of values of the input stream in the first stream and including a second block of values of the input stream in the second stream;
(b) processing the first stream and thereby converting the first stream into a third stream;
(c) processing the second stream and thereby converting the second stream into a fourth stream; and
(d) Block-TDM de-segmenting the third and fourth streams and thereby generating a single output stream.

37. The method of claim 36, wherein the Block-TDM de-segmenting of (d) involves:
Block-TDM multiplexing the third and fourth streams into a fifth stream; and
performing a decoding operation on the fifth stream and thereby generating the single output stream.

38. The method of claim 36, wherein the Block-TDM de-segmenting of (d) involves:
Block-TDM multiplexing the third and fourth streams into a fifth stream; and
performing a Digital Low Pass Filter (DLPF) operation on the fifth stream and thereby generating the single output stream.

39. The method of claim 36, wherein the Block-TDM segmenting of (a) involves:
   performing a precoding transformation on the input stream and thereby generating a precoded output stream; and
   Block-TDM de-multiplexing the precoded output stream and thereby generating the first and second streams.

40. An apparatus comprising:
   a Block-Time-Division-Multiplexing (Block-TDM) segmenter that segments a single input stream into a plurality of streams, the input stream comprising blocks of values, each block of values being a sequence of consecutive values of the input stream, and wherein said segmenter segments a first block of values into one of the plurality of streams the next block into a different one of the plurality of stream.

41. The apparatus of claim 40, further comprising:
   a first processing circuit that processes the first of the plurality of streams and outputs a first processed stream;
   a second processing circuit that processes the second of the plurality of streams and outputs a second processed stream; and
   a Block-TDM de-segmenter that receives the first and second processed streams and outputs a single output stream.

42. The apparatus of claim 41, wherein the Block-TDM de-segmenter includes:
   a Block-TDM multiplexer; and
   a decoder.

43. The apparatus of claim 42, wherein the Block-TDM segmenter includes:
   a precoder; and
   a Block-TDM multiplexer.

44. The apparatus of claim 43, wherein the first and second processing circuits are taken from the group consisting of: an Analog-to-Digital Converter (ADC), and a low pass filter.

45. An apparatus comprising:
   means for Block-Time-Division-Multiplexing (Block-TDM) segmenting a single stream into a first stream and a second stream, the single stream comprising blocks of values, each block of values being a sequence of consecutive values of the input stream, wherein the means for Block-TDM segmenting includes means for including a first block of values and in the first stream and including a second block of values in the second, and wherein the means for Block-TDM segmenting includes a precoder and a Block-TDM de-multiplexer;
   a first circuit that processes the first stream and thereby generates a third stream;
   a second circuit that processes the second stream and thereby generates a fourth stream; and
   means for Block-TDM de-segmenting the third and the fourth streams into a single output stream, wherein the means for Block-TDM de-segmenting includes a Block-TDM multiplexer and a decoder.

* * * * *